(12) United States Patent
Krippner et al.

(10) Patent No.: US 11,191,191 B2
(45) Date of Patent: Nov. 30, 2021

(54) AIR COOLED VARIABLE-FREQUENCY DRIVE

(71) Applicant: Schlumberger Technology Corporation, Sugar Land, TX (US)

(72) Inventors: Nick Paul Krippner, Houston, TX (US); Jacques Orban, Katy, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 16/771,821

(22) PCT Filed: Dec. 10, 2018

(86) PCT No.: PCT/US2018/064759
§ 371 (c)(1),
(2) Date: Jun. 11, 2020

(87) PCT Pub. No.: WO2019/118352
PCT Pub. Date: Jun. 20, 2019

(65) Prior Publication Data
US 2021/0176899 A1 Jun. 10, 2021

Related U.S. Application Data

(60) Provisional application No. 62/597,318, filed on Dec. 11, 2017.

(51) Int. Cl.
*H05K 7/20* (2006.01)
*E21B 36/00* (2006.01)

(52) U.S. Cl.
CPC ....... *H05K 7/20909* (2013.01); *E21B 36/001* (2013.01); *H05K 7/2039* (2013.01); *H05K 7/20145* (2013.01); *H05K 7/20209* (2013.01)

(58) Field of Classification Search
CPC .......... H05K 7/20909; H05K 7/20145; H05K 7/20209; H05K 7/2039; E21B 36/001
(Continued)

(56) References Cited

U.S. PATENT DOCUMENTS

| 1,731,879 A | 10/1929 | Thompson |
| 2,271,428 A | 1/1942 | Harry |

(Continued)

FOREIGN PATENT DOCUMENTS

| CN | 203515545 | 9/2018 |
| EP | 2698498 A1 | 2/2014 |

(Continued)

OTHER PUBLICATIONS

Intelligent Drilling Solutions, "AC Gear-Driven Drawworks for Land and Offshore Rigs", Brochure, retrieved at http://ids-oilfield.com/products/ac-drawworks/ on Dec. 12, 2018.

(Continued)

*Primary Examiner* — Anatoly Vortman
(74) *Attorney, Agent, or Firm* — Jeffrey D. Frantz

(57) ABSTRACT

Methods and apparatus for simultaneous operation of a variable-frequency drive (VFD) and a controller. The VFD drives an electric motor of a drilling rig machine. The controller controls temperature of an insulated-gate bipolar transistor device (IGBT) of the VFD by controlling an air mover in response to real-time temperature data. The air mover generates airflow into a passage, the airflow thereby interacting with radiating members extending into the passage from a heat sink thermally coupled with the IGBT in the inner housing outside the passage.

20 Claims, 9 Drawing Sheets

(58) Field of Classification Search
USPC .......................................................... 361/697
See application file for complete search history.

(56) References Cited

U.S. PATENT DOCUMENTS

| | | | |
|---|---|---|---|
| 2,345,662 A | 4/1944 | Fox | |
| 2,367,041 A | 1/1945 | Moore | |
| 2,370,855 A | 3/1945 | Fox | |
| 2,379,858 A | 7/1945 | Banzhaf | |
| 3,460,807 A | 8/1969 | Ivanovich | |
| 3,550,787 A | 12/1970 | Hicks | |
| 3,559,728 A * | 2/1971 | Lyman | H05K 7/206 165/55 |
| 3,696,634 A | 10/1972 | Ludin | |
| 3,738,614 A | 6/1973 | Peterson | |
| 3,821,881 A | 7/1974 | Harkias | |
| 4,434,971 A | 3/1984 | Cordrey | |
| 4,602,525 A | 7/1986 | Moroto et al. | |
| 4,699,208 A * | 10/1987 | Wolf | H05K 7/20918 165/122 |
| 4,790,373 A * | 12/1988 | Raynor | H01L 23/467 165/122 |
| 4,842,911 A | 6/1989 | Fick | |
| 4,907,473 A | 3/1990 | Fujitani et al. | |
| 5,823,248 A * | 10/1998 | Kadota | F28D 15/0233 165/104.33 |
| 5,914,860 A * | 6/1999 | Janko | F28F 21/084 361/710 |
| 6,144,556 A | 11/2000 | Lanclos | |
| 6,149,254 A * | 11/2000 | Bretschneider | H02B 1/565 312/213 |
| 6,152,848 A | 11/2000 | Williams et al. | |
| 6,164,369 A * | 12/2000 | Stoller | H05K 7/20572 165/104.33 |
| 6,182,945 B1 | 2/2001 | Dyer et al. | |
| 6,326,761 B1 * | 12/2001 | Tareilus | H02M 7/003 318/722 |
| 6,336,338 B1 | 1/2002 | Koren | |
| 6,354,158 B1 | 3/2002 | Eidem et al. | |
| 6,793,203 B2 | 9/2004 | Heinrichs et al. | |
| 6,840,880 B2 | 1/2005 | Glassner | |
| 6,889,752 B2 * | 5/2005 | Stoller | H05K 7/206 165/122 |
| 7,270,312 B1 | 9/2007 | Phipps | |
| 7,487,954 B2 | 2/2009 | Copp et al. | |
| 7,701,712 B2 * | 4/2010 | Kramer | H01L 23/473 361/695 |
| 7,896,315 B2 | 3/2011 | Faust | |
| 8,059,404 B2 * | 11/2011 | Miller | H02M 7/003 361/699 |
| 8,325,478 B2 * | 12/2012 | Siracki | H05K 7/20163 361/679.5 |
| 8,503,178 B2 * | 8/2013 | Chen | H05K 7/206 361/696 |
| 8,820,719 B2 | 9/2014 | Ferrari | |
| 9,637,022 B2 | 5/2017 | Gavling et al. | |
| 10,018,259 B2 | 7/2018 | Arnelof | |
| 10,590,940 B2 * | 3/2020 | Santolucito | H05K 7/20163 |
| 2001/0033743 A1 | 10/2001 | Kishita | |
| 2002/0184906 A1 | 12/2002 | Faries | |
| 2003/0103343 A1 | 6/2003 | Tozune et al. | |
| 2003/0111653 A1 | 6/2003 | Heinrichs et al. | |
| 2003/0169566 A1 | 9/2003 | Owens et al. | |
| 2004/0012983 A1 | 1/2004 | Fearing et al. | |
| 2004/0085728 A1 | 5/2004 | Barth et al. | |
| 2006/0072382 A1 | 4/2006 | Wakabayashi et al. | |
| 2006/0171115 A1 * | 8/2006 | Cramer | H05K 7/20918 361/695 |
| 2007/0091276 A1 | 4/2007 | Zakoji et al. | |
| 2008/0117602 A1 * | 5/2008 | Korich | H01G 2/08 361/715 |
| 2008/0283300 A1 | 11/2008 | Jones | |
| 2009/0139245 A1 | 6/2009 | Blackway et al. | |
| 2009/0195074 A1 | 8/2009 | Buiel | |
| 2010/0065355 A1 * | 3/2010 | Reddy | B60K 7/0023 180/65.31 |
| 2010/0127229 A1 | 5/2010 | Kverneland et al. | |
| 2010/0206831 A1 | 8/2010 | Faust | |
| 2011/0074165 A1 | 3/2011 | Grimes et al. | |
| 2012/0049625 A1 | 3/2012 | Hopwood | |
| 2012/0250255 A1 * | 10/2012 | Shigeno | H05K 7/20918 361/692 |
| 2012/0292992 A1 | 11/2012 | Williams | |
| 2013/0056279 A1 | 3/2013 | Osara et al. | |
| 2013/0215573 A1 * | 8/2013 | Wagner | H05K 7/2089 361/702 |
| 2014/0107881 A1 | 4/2014 | Sugiyama et al. | |
| 2014/0284108 A1 | 9/2014 | Pendleton et al. | |
| 2014/0298846 A1 | 10/2014 | Taras et al. | |
| 2014/0332182 A1 | 11/2014 | Taras et al. | |
| 2014/0364264 A1 | 12/2014 | Sten | |
| 2015/0083985 A1 | 3/2015 | Lervik | |
| 2015/0153792 A1 * | 6/2015 | Chen | F25D 23/12 361/679.47 |
| 2015/0198321 A1 | 7/2015 | Druchinin | |
| 2015/0233213 A1 | 8/2015 | Hu et al. | |
| 2015/0245537 A1 * | 8/2015 | Sakuma | H05K 7/20909 363/141 |
| 2015/0252661 A1 | 9/2015 | Glass | |
| 2015/0340961 A1 * | 11/2015 | Wen | H05K 7/20909 363/37 |
| 2015/0375975 A1 | 12/2015 | Flateland | |
| 2016/0003351 A1 | 1/2016 | Park | |
| 2016/0090279 A1 | 3/2016 | Hausladen et al. | |
| 2016/0178223 A1 * | 6/2016 | James | F24F 11/0001 165/250 |
| 2016/0268797 A1 * | 9/2016 | Li | H02M 1/32 |
| 2016/0289052 A1 | 10/2016 | Sorensen et al. | |
| 2017/0001845 A1 | 1/2017 | Moll | |
| 2017/0188488 A1 * | 6/2017 | Takezawa | H02M 7/48 |
| 2017/0305729 A1 | 10/2017 | Lautwein et al. | |
| 2017/0362067 A1 | 12/2017 | Hiekata et al. | |
| 2018/0023777 A1 | 1/2018 | Roucoules | |
| 2018/0100554 A1 | 4/2018 | Netecke et al. | |
| 2018/0251353 A1 | 9/2018 | Netecke et al. | |
| 2018/0252299 A1 | 9/2018 | Cave et al. | |

FOREIGN PATENT DOCUMENTS

| | | |
|---|---|---|
| JP | 2005236099 A | 9/2005 |
| JP | 2014122496 A | 7/2014 |
| WO | 2004097162 A1 | 11/2004 |
| WO | 2011159420 A2 | 12/2011 |
| WO | 2018201118 A1 | 11/2018 |

OTHER PUBLICATIONS

Namco, Machine & Gear Works Ltd., "AC Gear Driven Drawworks", brochure, released on Dec. 3, 2009.
Verco Systems, "Automated Drawworks Systems", Brochure, copyright 2002.

* cited by examiner

AIR COOLED VARIABLE-FREQUENCY DRIVE

CROSS-REFERENCE TO RELATED APPLICATIONS

This application claims priority to and the benefit of U.S. Provisional Application No. 62/597,318, titled "Outside Air Cooled Variable Frequency Drive," filed Dec. 11, 2017, the entire disclosure of which is hereby incorporated herein by reference.

BACKGROUND OF THE DISCLOSURE

On an alternating-current (AC) drilling rig, an AC generator set generates the electrical power used to operate the heavy rig equipment, such as the top drive, the mud pump, and the drawworks. The AC generator set includes an AC generator powered by a diesel engine or other prime mover. The resulting AC current is utilized by a variable-frequency drive (VFD) associated with the rig equipment component, such that the top drive, mud pump, and drawworks may each have a dedicated VFD.

The VFDs may be installed in an access-controlled room, known as a power house, a power-control room (PCR), a local electronics room (LER), and the like. While the VFDs are primarily utilized to power the main rig machines (e.g., the top drive, the mud pump, and the drawworks), smaller motors installed on or otherwise associated with the main machines (and/or perhaps other "non-main" rig equipment) may be also operated from the power house, such as cooling fans, centrifugal pumps (such as for feeding mud pumps), lubrication systems, and other examples.

SUMMARY OF THE DISCLOSURE

This summary is provided to introduce a selection of concepts that are further described below in the detailed description. This summary is not intended to identify indispensable features of the claimed subject matter, nor is it intended for use as an aid in limiting the scope of the claimed subject matter.

The present disclosure introduces an apparatus including an outer housing; an inner housing disposed within the outer housing; an insulated-gate bipolar transistor (IGBT) of a variable-frequency drive (VFD) for converting input power to output power for driving an electric motor of a drilling rig machine, the IGBT being disposed in the inner housing; a heat sink including a base coupled with the IGBT and radiating members extending from the base; ductwork at least partially defining a passage extending within the inner housing, the heat sink radiating members extending at least partially within the passage; an air mover to move air from outside the outer housing through the passage; and a controller to control operation of the air mover based on temperature of one or more of the air outside the outer housing, air between the inner and outer housings, air within the inner housing, air within the passage downstream from the heat sink radiating members, and/or the IGBT.

The present disclosure also introduces an apparatus including an outer housing; an inner housing disposed within the outer housing; a passage extending within the outer housing; an air mover to generate airflow within the passage from air from outside the outer housing; an IGBT of a VFD for converting input power to output power for driving an electric motor of a drilling rig machine, the IGBT being disposed in the inner housing outside the passage; a heat sink thermally coupled with the IGBT and having radiating members exposed to the airflow within the passage; and a controller to control temperature of the IGBT by controlling the air mover based on real-time temperature data.

The present disclosure also introduces a method including causing simultaneous operation of: a VFD driving an electric motor of a drilling rig machine; and a controller controlling temperature of an IGBT of the VFD by controlling an air mover in response to real-time temperature data, the air mover generating airflow into a passage extending within the outer housing, the airflow thereby interacting with radiating members extending into the passage from a heat sink thermally coupled with the IGBT in the inner housing outside the passage.

These and additional aspects of the present disclosure are set forth in the description that follows, and/or may be learned by a person having ordinary skill in the art by reading the material herein and/or practicing the principles described herein. At least some aspects of the present disclosure may be achieved via means recited in the attached claims.

BRIEF DESCRIPTION OF THE DRAWINGS

The present disclosure is understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
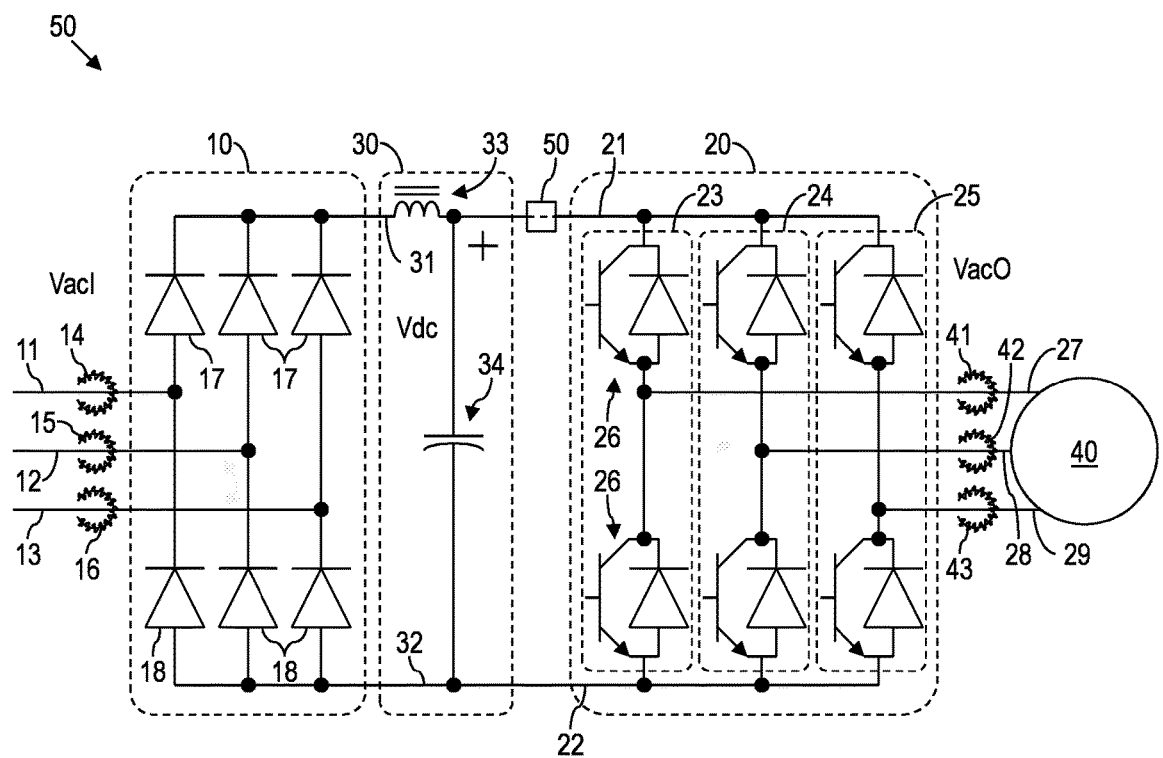
FIG. 1 is a schematic view of at least a portion of an example implementation of apparatus according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for simplicity and clarity, and does not in itself dictate a relationship between the various embodiments and/or configurations discussed.

It should also be understood that, although the terms first, second, etc., may be used herein to describe various elements, these elements should not be limited by these terms. These terms are used just to distinguish one element from another. For example, a first object could be termed a second object or step, and, similarly, a second object could be termed a first object or step, without departing from the scope of the present disclosure.

The terminology used in the description of the invention herein is for the purpose of describing particular embodiments only and is not intended to be limiting. As used in the description of the invention and the appended claims, the singular forms "a," "an," and "the" are intended to include the plural forms as well, unless the context clearly indicates otherwise. It should also be understood that the term "and/or" as used herein refers to and encompasses each possible combination of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a schematic view of an example implementation of a VFD 50 for driving an induction motor within the scope of the present disclosure. The VFD 50 includes a rectifier circuit 10, an inverter circuit 20, and perhaps a filter circuit 30.

The rectifier circuit 10 rectifies three-phase input power (VacI) from three inputs 11, 12, 13 (measurable via, for example, respective current probes and/or other measurement means 14, 15, 16) to generate DC power (e.g., with limited undulation). In the example implementation depicted in FIG. 1, each input 11, 12, 13 is connected between an anode of a corresponding first diode 17 and a cathode of a corresponding second diode 18. The cathodes of the first diodes 17 are connected to a positive lead 31 of the filter circuit 30, and the anodes of the second diodes 18 connected to a negative lead 32 of the filter circuit 30.

The filter circuit 30 may be or comprise an LC (inductor-capacitor) circuit and/or other means for reducing noise generated by the rectifier circuit 10, thus smoothing the direct current voltage (Vdc) fed to the inverter circuit 20. In the example implementation depicted in FIG. 1, the filter circuit 30 includes an inductor (e.g., solenoid) 33 connected in series between the positive lead 31 of the filter circuit 30 and a positive lead 21 of the inverter circuit 20, and a capacitor 34 connected between the positive and negative leads 31, 32 of the filter circuit 30. However, other implementations of the filter circuit 30 are also within the scope of the present disclosure.

The inverter circuit 20 produces, for delivery to inputs 27, 28, 29 of the motor 40, the three-phase output VacO (measurable via, for example, respective current probes and/or other measurement means 41, 42, 43) at the frequency and amplitude intended to drive the motor 40. In the example implementation depicted in FIG. 1, the inverter circuit 20 includes three single-phase inverter switches 23, 24, 25 that each include first and second inverters 26. The inverters 26 are depicted in FIG. 1 as simple transistor switches, but various other devices may be utilized for the inverters 26, including insulated-gate bipolar transistor (IGBT) devices. The motor input 27 is connected between the first and second inverters 26 of the switch 23, the motor input 28 is connected between the first and second inverters 26 of the switch 24, and the motor input 29 is connected between the first and second inverters 26 of the switch 25. However, other implementations of the inverter circuit 20 are also within the scope of the present disclosure.

The VacO generated by the inverter circuit 20 may range between about 5 Hertz (Hz) and about 100 Hz, although perhaps as high as 300 Hz. The measurement means 14-16 associated with the inputs 11-13, the measurement means 41-43 associated with the motor inputs 27-29, and perhaps one or more other sensors (e.g., sensor 50 connected between the filter circuit 30 and the inverter circuit 20) are examples of sensors that may be utilized to monitor and perhaps provide automatic or manual feedback for operation of the motor 40. These and/or other current, voltage, and/or frequency sensors (or other measurement means) may aid in managing the VFD 50 and other power electronics in relation with demand.

Figure 2:
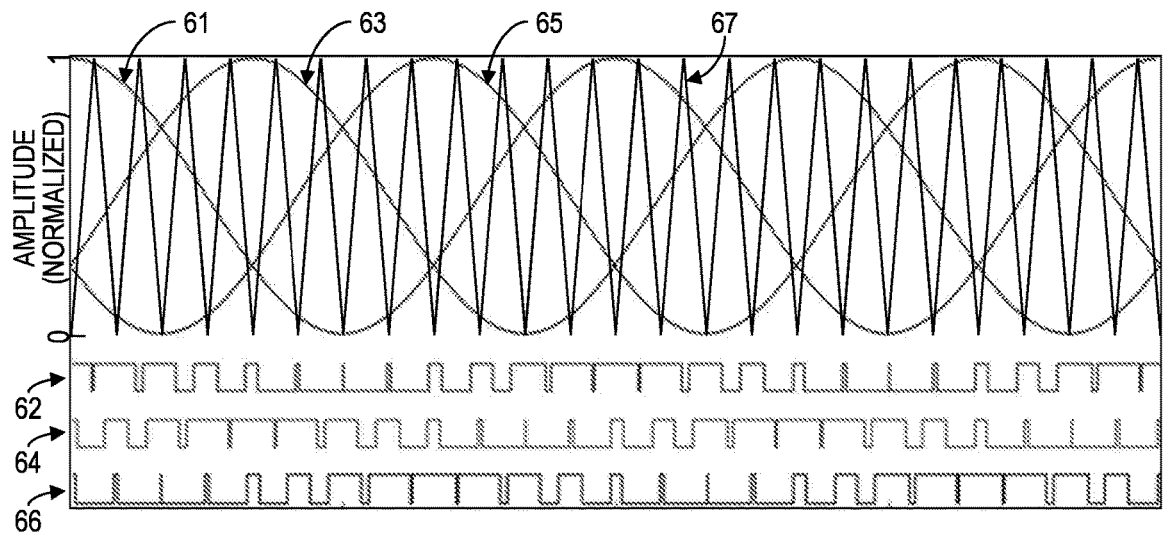
FIG. 2 is a graph depicting one or more aspects pertaining to the present disclosure.

FIG. 2 depicts an example pulse-width modulation (PWM) 60 that may be used to provide the three-phase output VacO at the intended frequency and amplitude to drive the motor 40 at a target speed. The driving signal intended to be delivered to the motor input 27 is represented by sine wave 61, and is generated by the PWM signal 62 via operation of the switch 23. Similarly, the driving signal intended to be delivered to the motor input 28 is represented by sine wave 63, which is generated by the PWM signal 64 via operation of the switch 24, and the driving signal intended to be delivered to the motor input 29 is represented by sine wave 65, which is generated by the PWM signal 66 via operation of the switch 25. Each intended driving signal 61, 63, 65 is compared with a reference triangle wave and/or other waveform 67. When the reference waveform 67 is less than the intended driving signal 61, 63, 65, the corresponding PWM signal 62, 64, 66 is at "high" state (e.g., 1), and when the reference waveform 67 is greater than the intended driving signal 61, 63, 65, the corresponding PWM signal 62, 64, 66 is at "low" state (e.g., 0).

The present disclosure introduces an integrated power and electronics unit (IPEM) that is integrated in a drilling rig machine skid, such as a mud pump skid, a drawworks skid, and others. The IPEM alone delivers the electrical and control support for the equipment on that skid. For example, the IPEM includes a VFD such as VFD 50 for the main motor of the primary machine (e.g., mud pump, drawworks, top drive, etc.) of the skid, a controller, and a networking interface. The IPEM may also include a VFD such as VFD 50 and one or more starters for one or more motors of secondary machines/functions, such as cooling blowers, centrifugal pumps, lubricating pumps, and other examples. The IPEM may also include means for data acquisition, such as from sensors associated with equipment on the skid, from equipment not integrated in the skid (such as the main controller of the drilling rig via the networking interface), and/or from mobile electronic devices (e.g., tablet computers, smartphones, laptop computers, etc.) proximate the IPEM. The IPEM may also include emergency stop means for abruptly halting operation of one or more components of the skid.

The IPEM receives electrical power from a power source at the wellsite via a power cable. Information exchanged between the IPEM and equipment not integrated in the skid (both to and from the IPEM) may be via a cable and/or wireless communication. The IPEM may also share information for coordination between multiple machines on the skid, such as in implementations in which the mud pump system includes multiple pumps that, via the information sharing, operate out of phase with respect to each other so as to reduce vibration and/or to achieve a more continuous output flow.

The IPEM and the main motor of the skid (including the related electronics for power and control) may be a single, integrated component, such as may be sold or marketed as a single product, in contrast to an assembly of separately marketed components. The IPEM and the main motor may also be an integrated component of a fully integrated skid. The integrated IPEM/motor/electronics product may be operable to perform for a predefined period of time with no (or very limited) maintenance. Moreover, the electronics and perhaps other portions of the integrated product may not be accessible by the end user, such that installation of the integrated product by the end user may be limited to connecting and disconnecting the power and communication cables, until the integrated product reaches the end of operational life and is replaced by a new or refurbished (OEM) unit.

Aspects of the IPEM may include: compact and low weight unit; integrated heat transfer from VFD power switches, including for dirty airflow; management of motor braking period; management of outdoor thermal and radiation conditions to maintain internal temperature within predetermined ranges; management of internal humidity; packaging that aids in preventing damage from vibration and shocks during handling, transport, and operation; and/or easy rig-up (e.g., simplified cable connection).

The IPEM may operate without additional usage of AC cooling or water flow utilized to transfer the heat generated by the VFD power switches to the outside the unit. The IPEM housing may contain the VFD (or part of the VFD), e.g., VFD 50, an associated programmable logic controller (PLC) and/or other controller, sensors and/or other means for measurement of conditions and operating parameters internal to the housing, and perhaps one or more filter components. The IPEM electronics may control a motor having a power rating above 100 horsepower (HP), perhaps higher than 1,000 HP, or even above 2,500 HP. The IPEM electronics may also control two or more such motors collectively, and may also control a resistor brake system. The IPEM is powered by a power source, which may be a single cable, and may be controlled via cable connection (e.g., metal and/or fiber-optic) and/or wireless communications.

The IPEM may be utilized for various traction motors of a drilling rig, such as motors of triplex and/or other pumping systems, drawworks systems, and top drives, among other examples. The IPEM may also be utilized for smaller motors on the rig, such as for a transfer pump, perhaps concurrently with the traction motors. Such implementations may be for fracturing pumping systems, such as may comprise one or more electrically driven triplex pumps, as well as low-pressure side components of a fracturing system, such as electrically driven centrifugal pumps, conveyor belts, mixers, agitators, and the like.

The IPEM may be mounted on the skid of a machine being powered by the VFD (such as VFD 50) and perhaps controlled by the IPEM. The IPEM may also be mounted directly on the motor of such machine.

Figure 3:
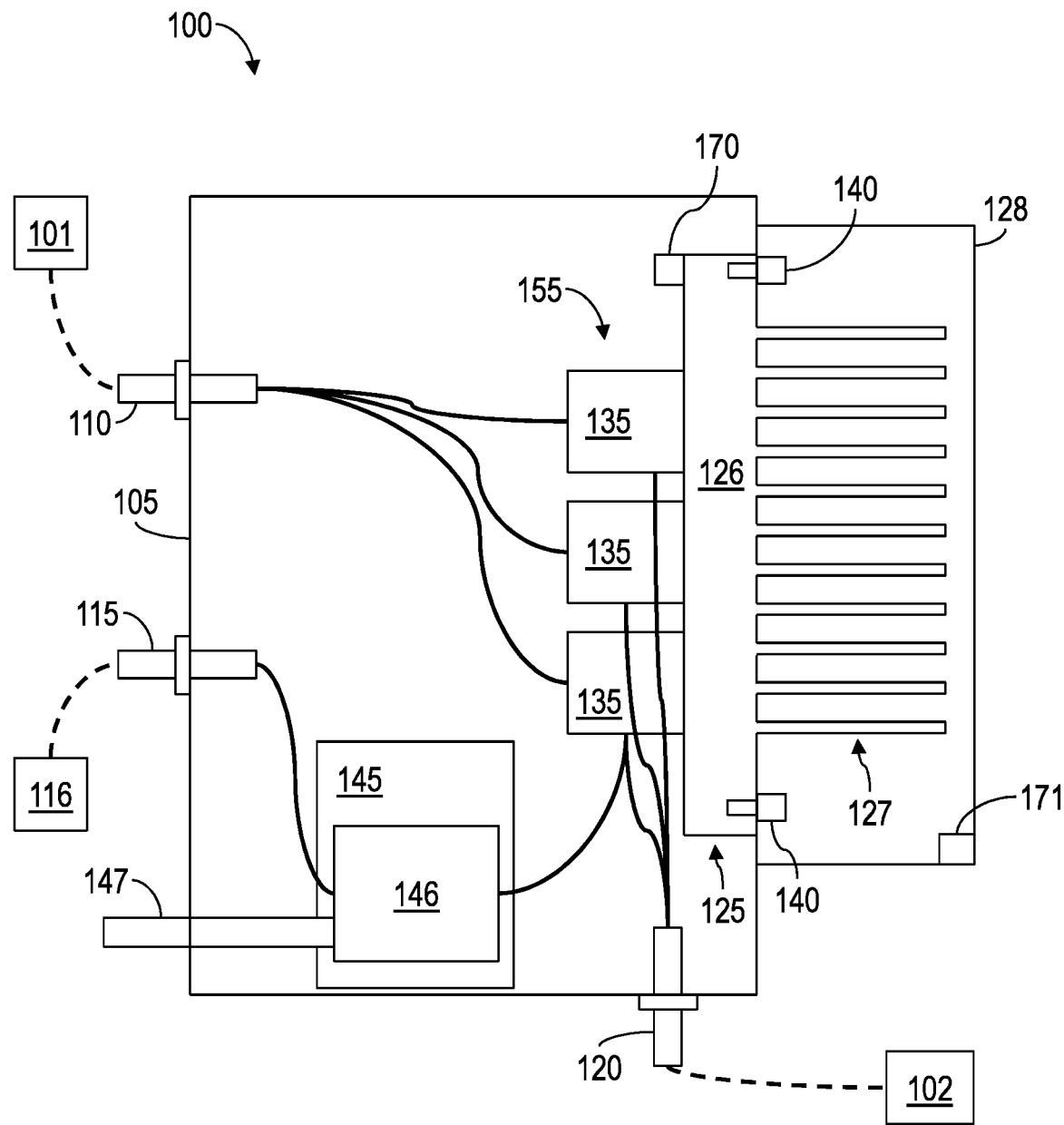
FIG. 3 is a schematic view of at least a portion of an example implementation of apparatus according to one or more aspects of the present disclosure.

FIG. 3 is a schematic view of at least a portion of an example implementation of an IPEM 100 according to one or more aspects of the present disclosure. The IPEM 100 includes a housing (e.g., a rectangular box that may be metal/metallic) 105, an input power bulkhead connector 110 for receiving electrical power from a power source 101, one or more communication bulkhead connectors 115 for receiving data and/or control signals from one or more data and/or control sources 116, an output power bulkhead connector 120 leading to one or more main motors 102 driven by the IPEM 100, and a heat sink 125 extending through an opening in (wall of) the housing 105. The housing 105 may have an access port/door (not shown) for assembly/maintenance purposes.

The IPEM 100 includes a VFD 155, shown in FIG. 3 as being implemented via three IGBT devices 135, although another number of IGBT devices 135 may be used. The IPEM 100 also includes a heat sink 125 comprising a base (e.g., a plate) 126 secured to the housing 105 via bolts and/or other attachment means 140. The heat sink 125 also includes fins and/or other elongated radiating members 127 extending from the base 126 and through an opening in the housing 105, thus extending externally from the housing 105. The IGBT devices 135 are secured to the base 126 (opposite the radiating members 127) in a manner permitting heat transfer (via conduction and/or otherwise) from the IGBT devices 135 to the radiating members 127. Ductwork 128 attached to and/or extending through the housing 105 may also be included to increase airflow and/or to focus airflow across the radiating members 127.

The IPEM 100 also includes a controller 145, which may be or comprise a PLC operable to control the IGBT devices 135. However, the controller 145 may also be operable to control other components of the IPEM 100, and perhaps components of a skid (not shown) comprising the IPEM 100, in addition to the IPEM 100. The controller 145 may include a communications interface 146 permitting communication between the controller 145 and other components of the IPEM 100. The communications interface 146 may also permit communication between the controller 145 and components not included in the IPEM 100, such as other components on the skid, and perhaps other components not located on the skid. Such communication, whether internal to the IPEM 100, internal to the skid, or external to the skid, may be via wired connection and/or via wireless communication (e.g., via antenna/receiver 147).

The heat sink 125 may be configured to sufficiently manage the heat generated by the IGBT devices 135. The IPEM 100 may thus be sealed to protect against exposure to water/moisture, dust, etc., such that, in some implementations, there may be no exchange of air between the inside of the IPEM 100 and the external environment outside of the IPEM 100. However, the controller 145, the VFD 155, and/or other internal components of the IPEM 100 may generate additional heat not sufficiently managed by the heat sink 125. In such embodiments, the IPEM 100 may also include a secondary radiator (not shown) and/or a fan (not shown) internal to the housing 105.

The IGBT devices 135 may be the main source of heat within the IPEM 100, and such heat may be effectively evacuated by the airflow within the ductwork 128 across the radiating members 127. The radiating members 127 may be made of a material with high thermal conductivity, such as copper, aluminum, and/or other metals/alloys. The material may be incrusted with polycrystalline diamond (PCD) and/or other materials to increase thermal conductivity and wear resistance, as well as to reduce the mean thermal expansion coefficient.

Other components of the IPEM 100 may generate smaller amounts of heat (the controller 145, sensors, etc.). Heat may be evacuated from these components in various ways, such as via conduction through the (metal/metallic) walls of the housing 105 and/or through one or more methods/apparatus disclosed in Patent Cooperation Treaty Patent Application Number PCT/US2018/030080, titled "Integrated Power and Electronics Unit for Drilling Machine," filed on Apr. 30, 2018, and claiming priority to U.S. Provisional Application No. 62/491,689, titled "Integrated Power and Electronics Unit for Drilling Machine," and filed on Apr. 28, 2017, the full disclosures of both of which are hereby incorporated herein by reference.

The IPEM 100 may also include various sensors operable for detecting temperature, pressure, humidity, airflow, and/or other parameters of the IPEM 100. In the example implementation depicted in FIG. 3, such sensors include a temperature sensor 170 for detecting the temperature of the base 126, and a temperature sensor 171 for detecting the temperature of the airflow within the ductwork 128. However, other sensors may also be included. The sensors may generate signals indicative of the sensed parameters, and the controller 145 may be operable to receive the signals (via wired or wireless connections) for use in operation of the IGBT devices 135 and/or other components, for example.

Figure 4:
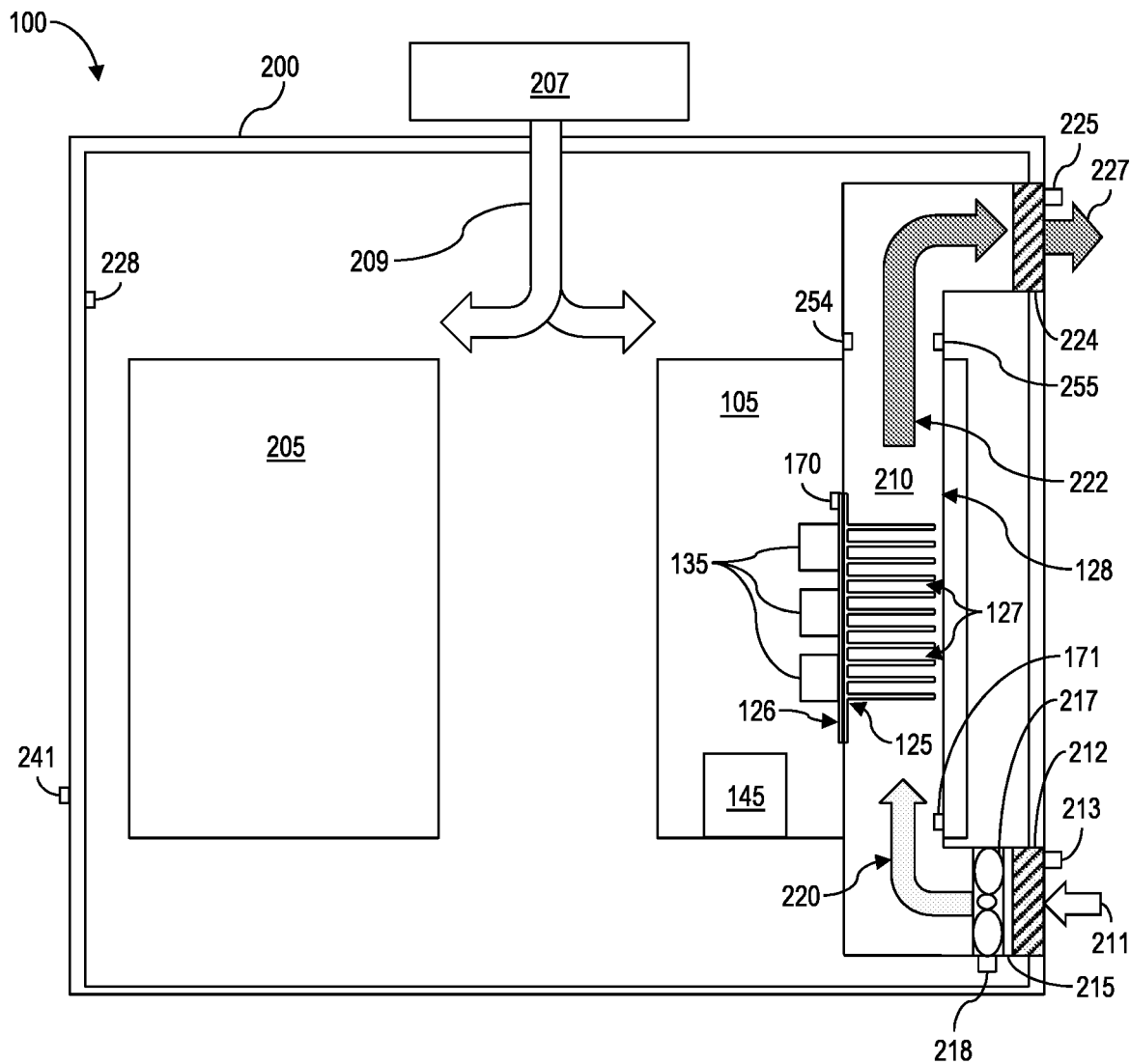
FIG. 4 is a schematic view of at least a portion of an example implementation of apparatus according to one or more aspects of the present disclosure.

FIG. 4 is a schematic view of an example implementation of the IPEM 100 within the scope of the present disclosure. Although the description that follows references elements shown in FIG. 4, it should be understood that the description should similarly apply to the common elements shown in FIGS. 4-7 herein. In FIG. 4, the IPEM 100 is depicted as involving multiple housings, including the housing 105, which is an inner housing within an outer housing 200. The outer housing 200 may also contain an additional inner housing 205, separate from and in addition to the inner housing 105. The inner housing 205 (when present) may contain other equipment. The outer housing 200 of the IPEM 100 may have its internal temperature controlled, particularly when operation of power, electrical, and/or electronic equipment disposed therein may generate heat. When control of the temperature of the volume inside the outer housing 200 is utilized, a heating, ventilation, and air conditioning unit (HVAC) 207 may be used. The HVAC unit 207 may be disposed outside the outer housing 200, e.g., proximate to at least one of the walls of outer housing 200, and may be operable to provide heating and/or cooling air 209 through the walls of the outer housing 200 to the volume inside the outer housing 200. However, the HVAC unit 207 may not provide heating and/or cooling air to a volume inside the inner housing 105, and may or may not provide heating and/or cooling air to a volume inside the inner housing 205.

The inner housing 105 contains one or more (e.g., three in FIG. 4) IGBT devices 135, and may also contain the controller 145. The IGBT devices 135 are thermally coupled to the heat sink 125, which includes the base 126 and radiating elements (e.g., fins) 127 extending at least partially, if not entirely, outside the volume of the inner housing 105. The radiating elements 126, and optionally at least a portion of the base 126, extend within a passage 210 that extends within the inner housing 105 and, thus, is distinct from the volume of the inner housing 105. The passage 210 may extend within the inner housing 105, as depicted in FIG. 4, or may be external to the inner housing 105, as depicted in FIG. 3.

That is, as shown in FIG. 4, the ductwork 128 may at least partially define the passage 210 as extending through the inner housing 105 with each wall of the passage 210/ductwork 128 separating the passage 210 from the volume of the inner housing 105. However, as shown in FIG. 3, the passage 210 may be externally adjacent the inner housing 105 instead of extending within the inner housing 105, such that one wall of the passage 210/ductwork 128 is (or is proximate to) a wall of the inner housing 105, and the radiating elements 127 (and perhaps the base 126) of the heat sink 125 extend into the passage 210 outside the volume of the inner housing 105. Thus, no portion of the passage 210/ductwork 128 would extend within the inner housing 105. Further, it is also contemplated that more than one wall but less than each wall of the passage 210/ductwork 128 may be proximate to, and/or contact at least in part, a corresponding wall of the inner housing 105, such that the IGBT devices 135 may be within the volume of the inner housing 105 and the radiating elements 127 may extend within the passage 210 in a manner permitting effective heat transfer away from the IGBT devices 135 and out of the inner housing 105.

Although the inner housings 105 and 205 are depicted in FIGS. 3 and 4 as being generally rectangular cuboids, the inner housings 105 and 205 may be otherwise shaped within the scope of the present disclosure. Similarly, although the passage 210 is depicted in FIG. 4 (and others) as being a generally rectangular cuboid, the scope of the present disclosure includes implementations in which the passage 210 has other shapes also sufficient to permit effective heat transfer away from the IGBT devices 135.

The following description refers generally to FIGS. 4-7, collectively, as well as to FIG. 4 specifically, as indicated by like reference numbers.

Air from outside the outer housing 200 may be drawn into the passage 210 at an external air intake (inlet) 211. The external air intake 211 may include external air intake baffles 212 or other means for selectively controlling whether and how much air can be taken into the passage 210 from outside the outer housing 200. Although FIG. 4 shows the external air intake baffles 212 as being controllable by an actuator 213 to permit automatic and/or remote operation thereof (e.g., by the controller 145), control may also or instead by exercised manually. Indeed, a component or set of components, individually or as an assembly, that is/are described herein as being controllable by an actuator permitting automatic and/or remote operation is to be understood to be also or instead be manually controllable.

When the external air intake baffles 212 are at least partially open, an external air intake blower (air mover) 217 may be operable to draw air from the external air intake 211 into the passage, thereby creating airflow 220. An actuator 218 may permit automatic and/or remote operation of the fan, such as to circulate air for the airflow 220 within the passage 210 at a predetermined and/or controllable speed.

Also shown in FIG. 4 is an optional external air intake filter 215 for blocking particles from outside the outer housing 200. For example, the external air intake filter 215 may be block particulate and/or other matter that could be large enough to clog the radiating members 127 of the heat sink 125. Although shown in FIG. 4 as being positioned between the external air intake baffles 212 and the external air intake blower (air mover) 217, the external air intake filter 215 may be disposed at other locations upstream from the radiating elements 127. However, the external air intake filter 215 otherwise permits the external air intake blower 217 to create airflow 220 within the passage 210, even if permitting passage of particles that are small enough to pass through/around the radiating members 127.

The air intake filter 215 described herein, alone or in conjunction with one or more additional air filters disposed upstream of the radiating members 127 within the passage 210, may aid in ensuring that the outside air is sufficiently clean to avoid creation of a dust/dirt layer on the external surfaces of the radiating members 127. Such designs may reduce or eliminate sand, proppant dust, water droplets, etc., that may detrimentally affect heat transfer between the airflow 220 and the radiating members 127. In some cases, such designs may introduce a series of changes in air flow so that such particles fall to the bottom of the passage 210 or otherwise avoid the radiating members 127. Such designs may reduce or eliminate mud droplets, such as when operating in the vicinity of mud splash, although longer air intake ductwork and/or other means may be used to move the air inlet further away from the potential mud splash source. To eliminate large/longer particulate matter, such as fiber, flake, leaves, paper, etc., a hydrocyclone may be used, although the heat sink/filter designs described above may sufficiently perform this function.

The airflow 220 within the passage 210 (depicted in FIG. 4 by light shading, representing relatively cold air temperature) can pass around/among the radiating members 127 within the passage 210, thus permitting thermal transfer between the airflow 220 and the radiating members 127 to remove heat therefrom and thus away from the IGBT devices 135 that are disposed outside the passage 210 within the inner housing 105. After the airflow 220 has undergone its heat transfer with the radiating members 127, it becomes airflow 222 (depicted in FIG. 4 by dark shading, representing increased air temperature) and proceeds toward discharge from the passage 210. In order to be discharged from the passage 210 to the environment outside the outer housing 200, the airflow 222 may pass through and/or be regulated by external air discharge baffles 224 or other means for selectively controlling whether and how much air can be discharged from the passage 210 to outside the outer housing 200. Although FIG. 4 shows the external air discharge baffles 224 as being controllable by an actuator 225 to permit automatic and/or remote operation thereof (e.g., by the controller 145), control may also or instead by exercised manually. When the external air discharge baffles 224 are at least partially open, the airflow 222 may proceed to the external air discharge (outlet) 227.

Although FIG. 4 shows the airflow 220 as being drawn (pulled) from external air intake (inlet) 211 and circulated (pushed) toward the heat sink 125 within the passage 210 by means of the external air intake blower/fan 217, the external air intake blower/fan 217 or an additional blower/fan (not shown) may be disposed downstream from the radiating members 127, such as near the external air discharge baffles 224 corresponding to its representation in FIG. 4 near the external air intake baffles 212. In such implementations, the airflow 220 is drawn (pulled) through the radiating elements 127 within the passage 210, instead of (and/or as well as) being pushed through the radiating elements 127 within the passage 210.

The IPEM 100 may also comprise one or more temperature sensors 170 operable to detect a temperature of the base 126 and/or, by extension, a temperature indicative of the IGBT devices 135. The IPEM 100 may also comprise one or more temperature sensors 171 operable to detect a temperature of the airflow 220 within the ductwork 128/passage 210 upstream of the radiating members 127. Each temperature sensor 170 may be disposed on a portion of the base 126 inside the inner housing 105, one of the IGBT devices 135, or a portion of the base 126 outside the inner housing 105 (e.g., within the ductwork 128/passage 210). One or more temperature sensors 254 may be operable to detect a temperature of the airflow 222 within the ductwork 128/passage 210 downstream of the radiating members 127. One or more temperature sensors 228 may be operable to detect a temperature within the outer housing 200 but outside of the inner housing 105 (and also outside of the inner housing 205, if present). One or more temperature sensors 241 may be operable to detect a temperature outside the outer housing 200. One, more than one, or each of these temperature sensors may be monitored by a controller (such as the controller 145) to aid in managing the temperature of the IGBT devices 135 and/or other components of the IPEM 100.

The IPEM 100 may also comprise an airflow sensor 255 within the ductwork 128/passage 210. The passage airflow sensor 255 may be located downstream from the radiating members 127 and may generate a signal indicative of the airflow 222. The temperature sensor 254 and the airflow sensor 255 may be co-located. In other implementations, the airflow sensor 255 may be located within the ductwork 128 upstream of the radiating members 127, so as to be indicative of the airflow 220 instead of the airflow 222. For example, the airflow sensor 255 may be co-located with the temperature sensor 171.

Aside from the temperature sensors 170, 171, 228, 241, and 254 and the airflow sensor 255, the IPEM 100 may include additional temperature and/or airflow sensors, and may include various sensors operable for detecting pressure, humidity, and/or other parameters of the IPEM 100. Non-limiting examples of such additional sensors may include a temperature sensor for detecting temperature inside the inner housing 105, a temperature sensor for detecting temperature inside the inner housing 205, a temperature sensor for detecting temperature inside the HVAC unit 207, an airflow sensor for detecting air flow rate of heating and/or cooling air 209 from the HVAC unit 207, and/or combinations thereof, among other examples also within the scope of the present disclosure. Such sensors may generate signals indicative of the sensed parameters, and the controller 145 may be operable to receive the signals (via wired or wireless connections) for use in operation of the IGBT devices 135 and/or other components, for example.

The implementation shown in FIG. 4 may be advantageous for use in relatively cold outdoor temperatures, among other implementations within the scope of the present disclosure. That is, by directing cold external air through the passage 210 and over/across the radiating members 127, instead of using an HVAC unit such as the HVAC unit 207, increased capacity to remove heat (i.e., based on a heightened temperature difference between air at the external air intake (inlet) 211 and that of the heat sink 125) can be utilized with decreased power demand. For example, the blower/fan 217 may use less power than operating an HVAC unit at colder outdoor temperatures. In addition, with colder outdoor temperatures, it may be inefficient to use the cold outdoor air to cool the volume within the outer housing 200 just to cool the IGBT devices 135 within the inner housing 105, which, if the outdoor air were cold enough, may result in overcooling other components besides the IGBT devices 135. Even at moderate outdoor air temperatures, the use of a blower/fan instead of an HVAC unit (i.e., without "conditioning" or significantly altering the temperature of outdoor air) to manage the heat from operation of the IGBT devices 135 may save on power output and/or reduce both the duty (for otherwise managing the interior volume of the outer housing 200) and the capacity (size necessary for managing the total amount of heat generated in the IPEM 100) of the HVAC unit 207.

Figure 5:
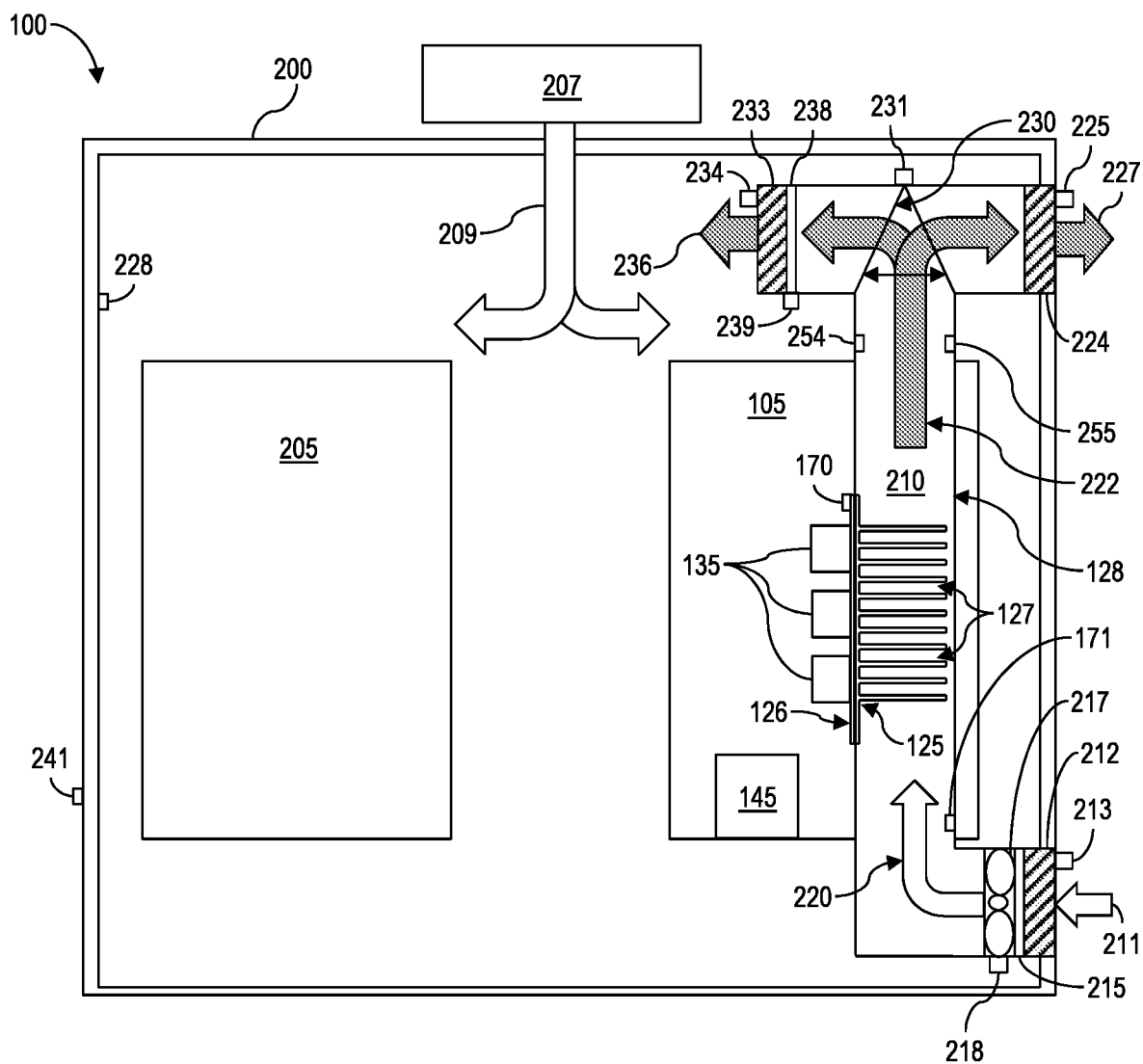
FIG. 5 is a schematic view of at least a portion of an example implementation of apparatus according to one or more aspects of the present disclosure.

FIG. 5 is a schematic view of a portion of another implementation of the IPEM 100 shown in FIG. 4. The IPEM 100 shown in FIG. 5 is substantially the same as the IPEM 100 shown in FIG. 4, except as described below.

In the implementation in FIG. 5, the airflow 222 downstream of the radiating members 127, whether alternatively or in addition to being directed outside the outer housing 200 (through external air discharge baffles 224 as external air discharge 227), may be directed into the volume between the inner housing 105 and the outer housing 200 (i.e., within the outer housing 200 but outside the first inner housing 105, including outside the inner housing 205, if present). For example, an air discharge control valve/baffle 230 may be operable to selectively direct the airflow 222 in either (or both) direction(s) to discharge. Although FIG. 5 shows the air discharge control valve/baffle 230 as being controllable by an actuator 231 to permit automatic and/or remote operation thereof (e.g., by controller 145), control may also or instead by exercised manually.

When the air discharge control valve/baffle 230 closes off discharge of the airflow 222 to the volume between the inner housings 105 and 205 (if present) and the outer housing 200, operation may be as shown in FIG. 4, with the airflow 222 being discharged to the external air discharge (outlet) 227 through the external air discharge baffles 224. However, when the air discharge control valve/baffle 230 closes off discharge of the airflow 222 to outside the outer housing 200, the airflow 222 can instead pass through and/or be regulated by internal air discharge baffles 233 or other means for selectively controlling whether and how much air can be discharged from the passage 210 to the volume between the inner housings 105 and 205 and the outer housing 200. Although FIG. 5 shows the internal air discharge baffles 233 as being controllable by an actuator 234 to permit automatic and/or remote operation thereof (e.g., by the controller 145), control may also or instead by exercised manually. When the internal air discharge baffles 233 are at least partially open, the airflow 222 may proceed to the internal air discharge (outlet) 236.

As mentioned in regard to FIG. 4, although FIG. 5 shows the airflow 220 as being pulled from external air intake (inlet) 211 and pushed toward the heat sink 125 within the passage 210 via the external air intake blower/fan 217, it is additionally or alternatively possible for the air intake blower/fan 217 or an additional blower/fan (not shown) to be disposed downstream from the heat sink 125, such as situated near the internal air discharge baffles 233 corresponding to its representation in FIG. 5 near the external air intake baffles 212. In such implementations, the airflow 220 is drawn (pulled) through the radiating elements 127 within the passage 210 from downstream instead of (and/or as well as) being pushed from upstream, depending upon whether the blower/fan 217 is relocated or an additional blower/fan is added.

Also shown in FIG. 5 is an optional internal air discharge dehumidifier 238 for reducing humidity (moisture content) of the airflow 222 being directed to the volume between the inner housing(s) 105 (and 205, if present) and the outer housing 200. For example, the dehumidifier 238 may reduce humidity within the volume of the outer housing 200. The dehumidifier 238, a filter (such as those described above or elsewhere herein), and/or other means may also block water droplets and/or other particulate that could be large enough to clog the radiating members 127. Although FIG. 5 shows the dehumidifier 238 as being controllable by an actuator 239 to permit automatic and/or remote operation thereof (e.g., by the controller 145), control may also or instead by exercised manually.

Also, although shown in FIG. 5 to be proximate to the internal air intake baffles 233, the internal air discharge dehumidifier 238, when present, may be disposed at another location downstream from the radiating elements 127. However, the dehumidifier 238 may also be located downstream of the air discharge control valve/baffle 230. For example, air being discharged to outside the outer housing 200 may not be dehumidified.

The example implementation shown in FIG. 5 may be advantageous for relatively cold outdoor temperatures and/or in the event of an equipment failure at or near the external air discharge 227. For example, in a relatively cold external environment, the HVAC unit 207 may provide heating air 209 to the volume between the inner housing(s) 105 (and 205, if present) and the outer housing 200. By exploiting the warmer airflow 222 from the passage 210 that has absorbed significant heat from the radiating members 127, the heating duty of the HVAC unit 207 may be reduced with little or no additional power consumption, while still effectively managing the heat generated by the IGBT devices 135 within the inner housing 105. This may also allow a more efficient management of the heat generated by operation of the IGBT devices 135 than conventional designs, perhaps saving on power output and/or reducing the requisite capacity of the HVAC unit 207. Also, if the external air discharge baffles 224 (and/or its actuator 225) fail, for example, the internal air discharge 236 may offer a way to continue thermal transfer without needing to cease operation of the IGBT devices 135.

Figure 6:
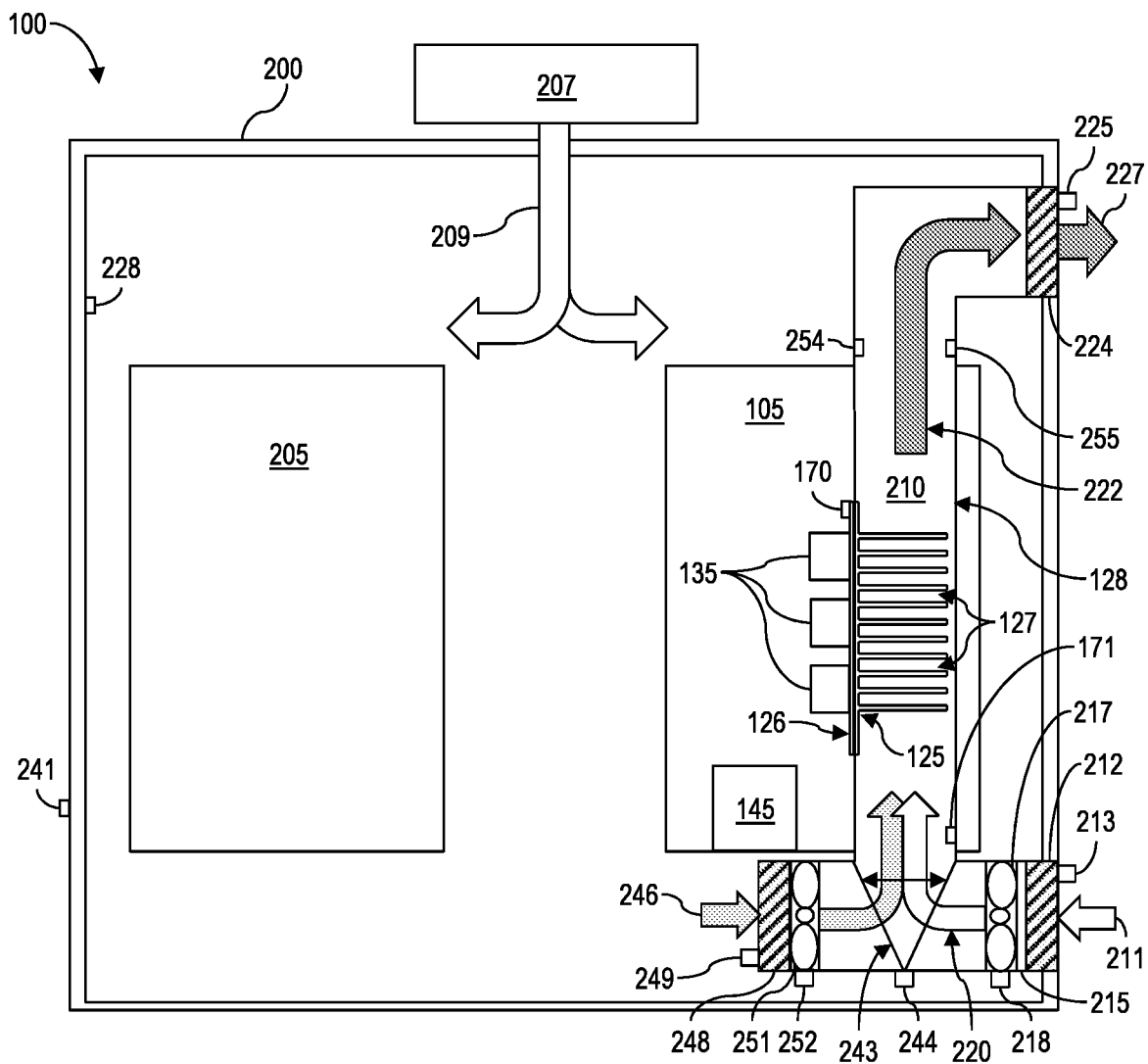
FIG. 6 is a schematic view of at least a portion of an example implementation of apparatus according to one or more aspects of the present disclosure.

FIG. 6, like FIG. 5, shows another implementation of the IPEM 100 shown in FIG. 4. The IPEM 100 shown in FIG. 6 is substantially the same as the IPEM 100 shown in FIG. 4, except as described below.

Analogous to the implementation in FIG. 5, the implementation in FIG. 6 shows that the airflow 220 upstream of the radiating members 127, alternatively or in addition to being drawn from outside the outer housing 200 (through external air intake baffles 212 as external air intake 211), can in certain circumstances be drawn from the volume between the inner housing 105 and the outer housing 200 (i.e., within the outer housing 200 but outside the inner housing 105, and also outside the inner housing 205, if present). To permit that possibility, an air intake control valve/baffle 243 may be operable to selectively generate the airflow 220 from either (or both) direction(s) as intake to the ductwork 128/passage 210. Although FIG. 6 shows the air intake control valve/baffle 243 as being controllable by an actuator 244 to permit automatic and/or remote operation thereof (e.g., by the controller 145), control may also or instead by exercised manually.

When the air intake control valve/baffle 243 closes off intake of the airflow 220 from the volume between the inner housing(s) 105 (and 205, if present) and the outer housing 200, operation may be as shown in FIG. 4, with the airflow 220 being drawn from the external air intake (inlet) 211 through the external air intake baffles 212. However, when the air intake control valve/baffle 243 closes off intake of the airflow 222 from outside the outer housing 200, the airflow 220 can instead be drawn in from an internal air intake 246 through internal air intake baffles 248 and/or other means for selectively controlling whether and how much air can be discharged from the passage 210 to the volume between the inner housing(s) 105 (and 205, if present) and the outer housing 200. When the internal air intake baffles 248 are at least partially open, air from within the outer housing 200 can be drawn in and/or regulated by an internal air intake blower/fan 251. Although FIG. 6 shows the internal air intake baffles 248 and the internal air intake blower/fan as being controllable by actuators 249 and 252, respectively, to permit automatic and/or remote operation thereof (e.g., by the controller 145), control may also or instead by exercised manually for one or each of those two components.

As mentioned in regard to FIG. 4, although FIG. 6 shows the airflow 220 as being pushed to external air discharge (outlet) 227 and, then, toward the radiating members 127 within the passage 210 via the internal air intake blower/fan 251, it is additionally or alternatively possible for the internal air intake blower/fan 251 or an additional blower/fan (not shown) to be disposed downstream from the radiating members 127, e.g., disposed near the external air discharge baffles 224 corresponding to its representation in FIG. 6 near the internal air intake baffles 248. In such implementations, the airflow 220 is drawn (pulled) through the radiating elements 127 within the passage 210 from downstream, instead of and/or as well as being pushed from upstream, depending upon whether the blower/fan 251 is relocated or an additional blower/fan is added.

FIG. 6 does not depict an internal air intake filter corresponding to the external air intake filter 215. In this regard, the air from the volume within the outer housing 200 may already be filtered, or such filtering to remove particulate matter that could clog the radiating members 127 may not be crucial. However, such filtering may be present.

Although not limited as such, the example implementation shown in FIG. 6 may be advantageous when, among other examples, operating with extremely cold outdoor temperatures, and/or in the event of an equipment failure at or near the external air intake 211. For example, in an extremely cold external environment, the air from outside the outer housing 200 may be so cold that it could absorb too much heat when flowing over/across the radiating members 127, even at relatively low flow rates. Reducing the temperature of the IGBT devices 135 too much may disadvantageously cause them to malfunction and/or operate in a non-optimal temperature regime. This eventuality could be less efficient, heat management-wise (as it would put additional strain on the HVAC unit 207 to manage temperature within the outer housing 200 and provide enough airflow 209 for a portion of that to be directed to the internal air intake 246), but it may provide a useful contingency for temporary operation in extremely cold outdoor conditions. Of course, other operations are also within the scope of the present disclosure, as well as other potential advantages. Also, if the external air intake baffles 212 (and/or its actuator 213) fail, for example, the internal air intake 246 may offer a way to continue thermal transfer without the obligation of ceasing operation of the IGBT devices 135.

Figure 7:
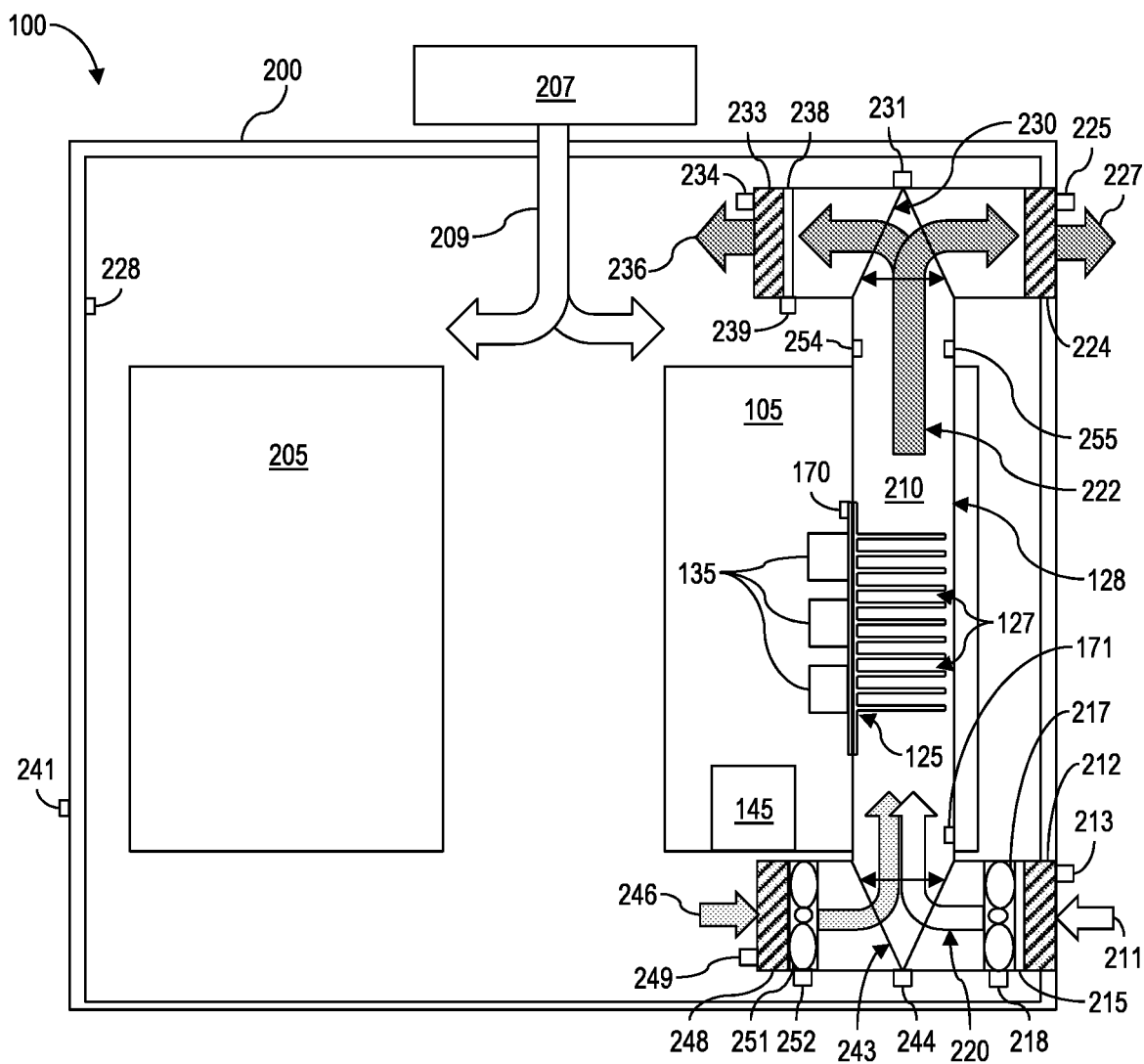
FIG. 7 is a schematic view of at least a portion of an example implementation of apparatus according to one or more aspects of the present disclosure.

FIG. 7 shows another implementation of the IPEM 100 shown in FIG. 4. The IPEM 100 shown in FIG. 7 is substantially the same as the IPEM 100 shown in FIG. 4, except with both the modifications to the discharge shown in FIG. 5 and the modifications to the intake shown in FIG. 6. Thus, FIG. 7 demonstrates a particularly flexible implementations for operation at relatively and/or extremely cold outdoor temperatures, with contingencies for equipment failures and/or heating/power efficiencies to be gained under a broad set of operational environments.

In one, some, or each implementation shown in FIGS. 4-7, the features/system intended to transfer heat away from the IGBT devices 135 may not comprise a device primarily operable to alter temperature of air directed into the passage 210 (other than the heat sink 125). Additionally, or alternatively, in one, some, or each implementation shown in FIGS. 4-7, the mover of air into and/or through the passage 210 (e.g., comprising at least the internal and/or external air intake blower/fan and the corresponding baffles) may not comprise a device primarily operable to alter temperature of the air directed into the passage 210.

In one, some, or each implementation shown in FIGS. 4-7, the utilization of a separate air cooling system (e.g., containing substantially no device whose primary purpose is to alter temperature of air taken in from outside the outer housing before being directed across the radiating members 127) to remove heat generated by component(s) of a VFD may permit a duty and/or a capacity of the HVAC unit to be from about 10% to about 65% of a duty and/or a capacity of an HVAC unit in an otherwise identical IPEM but in which there is no separate air cooling system, such that heat generated by IGBT devices is transferred into an outer housing before being transferred out from the outer housing. In assessing capacity and/or duty of multiple HVAC units in a given system, such capacities and/or duties should be understood to be additive (for capacities) and/or a weighted averaged (for duties).

In each of FIGS. 4-7, the controller 145 may be operable to monitor one, some, or each of the sensors shown (e.g., 170, 171, 228, 241, 254, and 255, as well as other sensors that may exist) in order to enable unified heat management of the IPEM 100. Optionally, the controller 145 may also be operable to control the HVAC unit 207 (and heating and/or cooling air 209 emanating therefrom).

In each of FIGS. 4-7, the external air intake 211 and/or the external air discharge 227 may each/both have a self-orienting exit guide (not shown) that rotates depending on the direction of wind external to the IPEM 300, such as to ensure that the external air discharge 227 is directed downwind from the external air intake 211 and/or so that the external air intake 211 does not form an effective loop by pulling in heated air from the external air discharge 227, such as would otherwise disrupt the ability/efficiency of heat removal from the radiating elements 127 within the passage 210. For example, an exhaust tube (not shown) may be pivotably attached to the baffles 224 at the external air discharge 227, such that wind spins the exhaust tube toward a downwind direction. One or more vanes and/or other means (also not shown) may be attached to the exhaust tube to provide more sensitivity to the wind. Additionally, or alternatively, there may be more than one external air intake 211, such that airflow 220 within the passage 210 may be selectively garnered from one, some, or each external air intake 211, depending on wind direction, nearby related operations, and/or other factors. Additionally, or alternatively, more than one external air discharge 227 may exist, such that airflow 222 within the passage 210 may be selectively or collectively directed to one, some, or each external air discharge 227, depending on wind direction and/or other factors.

When several IPEMs are installed in a limited space, the radiating members 127 of each VFD may be used to cool multiple IGBT devices 135 in series within the same passage 210 defined by the ductwork 128, or in parallel within different passages 220 defined by corresponding ductwork 128. The radiating members 127 may also be used to cool multiple IGBT devices 135 in a combination of series and parallel, depending upon how many VFDs are installed in how limited a space.

IPEM implementations within the scope of the present disclosure may be water tight. For example, the IPEM may have an International/Ingress Protection (IP) Rating of IP54, such that ingress of dust is not entirely prevented but does not enter in sufficient quantity to interfere with satisfactory operation, there is complete protection against contact, and water splashing (and/or humidity building up) against the inner housing 105 from whatever direction may have no harmful effect. However, other IP ratings are also within the scope of the present disclosure.

Figure 8:
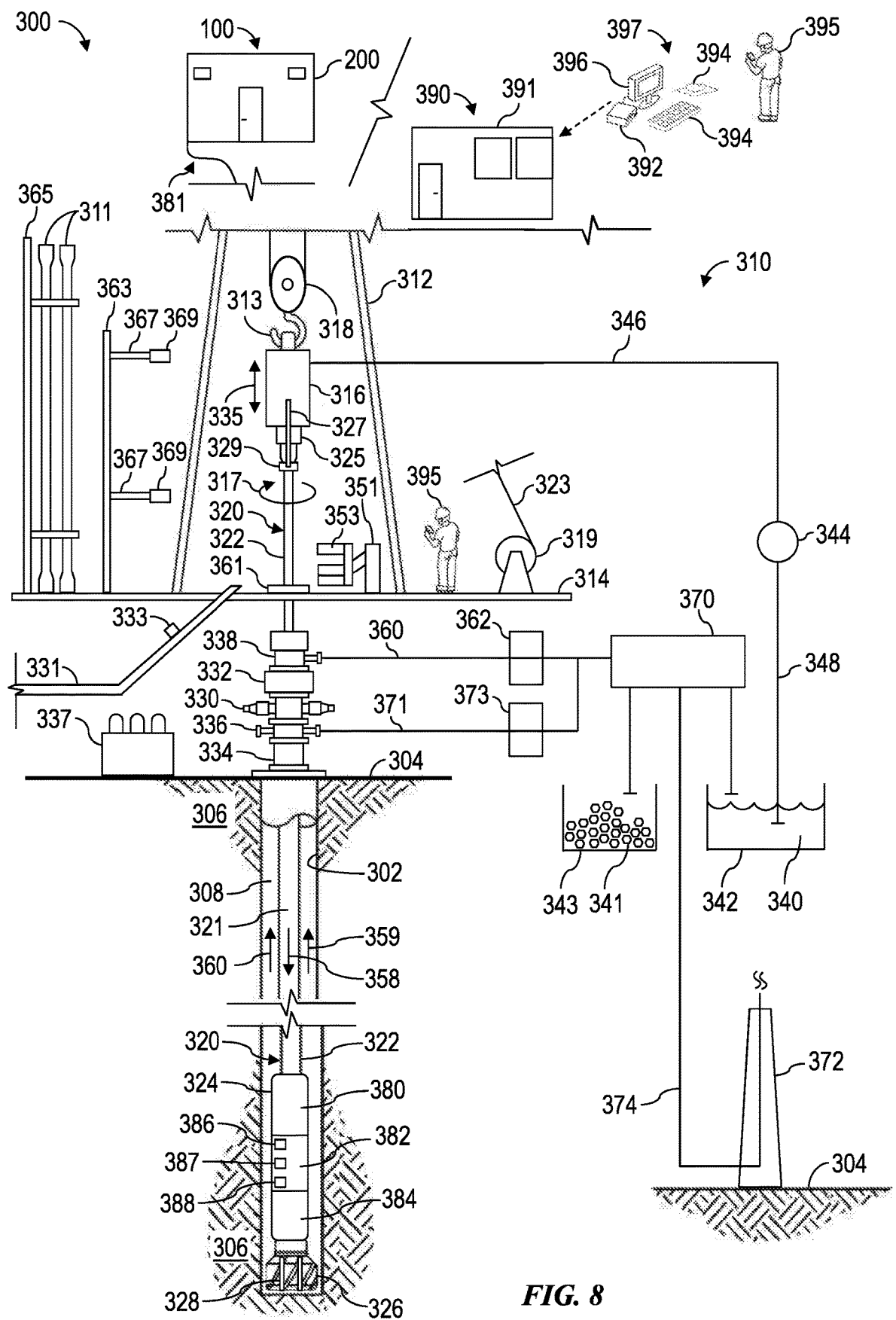
FIG. 8 is a schematic view of at least a portion of an example implementation of apparatus according to one or more aspects of the present disclosure.

FIG. 8 is a schematic view of at least a portion of an example implementation of a well construction system 300 according to one or more aspects of the present disclosure. The well construction system 300 represents an example environment in which one or more aspects of the present disclosure described elsewhere herein may be implemented. Although the well construction system 300 is depicted as an onshore implementation, the aspects described below are also applicable to offshore implementations.

The well construction system 300 is depicted in relation to a wellbore 302 formed by rotary and/or directional drilling from a wellsite surface 304 and extending into a subterranean formation 306. The well construction system 300 includes surface equipment 310 located at the wellsite surface 304, and also includes or is utilized in conjunction with a drill string 320 suspended within the wellbore 302. The surface equipment 310 may include a mast, a derrick, and/or another support structure 312 disposed over a rig floor 314. The drill string 320 may be suspended within the wellbore 302 from the support structure 312. The support structure 312 and the rig floor 314 are collectively supported over the wellbore 302 by legs and/or other support structures (not shown).

The drill string 320 may comprise a bottom-hole assembly (BHA) 324 and means 322 for conveying the BHA 324 within the wellbore 302. The conveyance means 322 may comprise drill pipe, heavy-weight drill pipe (HWDP), wired drill pipe (WDP), tough logging condition (TLC) pipe, coiled tubing, and/or other means for conveying the BHA 324 within the wellbore 302. A downhole end of the BHA 324 may include or be coupled with a drill bit 326. Rotation of the drill bit 326 and the weight of the drill string 320 collectively operate to form the wellbore 302. The drill bit 326 may be rotated from the wellsite surface 304 and/or via a downhole mud motor (not shown) connected with the drill bit 326.

The BHA 324 may also include various downhole tools 380, 382, 384. One or more of such downhole tools 380, 382, 384 may be or comprise an acoustic tool, a density tool, a directional drilling tool, an electromagnetic (EM) tool, a formation sampling tool, a formation testing tool, a gravity tool, a monitoring tool, a neutron tool, a nuclear tool, a photoelectric factor tool, a porosity tool, a reservoir characterization tool, a resistivity tool, a rotational speed sensing tool, a sampling-while-drilling (SWD) tool, a seismic tool, a surveying tool, a torsion sensing tool, and/or other measuring-while-drilling (MWD) or logging-while-drilling (LWD) tools.

One or more of the downhole tools 380, 382, 384 may be or comprise an MWD or LWD tool comprising a sensor package 386 operable for the acquisition of measurement data pertaining to the BHA 324, the wellbore 302, and/or the formation 306. One or more of the downhole tools 380, 382, 384 and/or another portion of the BHA 324 may also comprise a telemetry device 387 operable for communication with the surface equipment 310, such as via mud-pulse telemetry. One or more of the downhole tools 380, 382, 384 and/or another portion of the BHA 324 may also comprise a downhole processing device 388 operable to receive, process, and/or store information received from the surface equipment 310, the sensor package 386, and/or other portions of the BHA 324. The processing device 388 may also store executable computer programs (e.g., program code instructions), including for implementing one or more aspects of the operations described herein.

The support structure 312 may support a driver, such as a top drive 316, operable to connect (perhaps indirectly) with an uphole end of the conveyance means 322, and to impart rotary motion 317 and vertical motion 335 to the drill string 320 and the drill bit 326. However, another driver, such as a kelly and/or rotary table (neither shown), may be utilized instead of or in addition to the top drive 316 to impart the rotary motion 317. The top drive 316 and the connected drill string 320 may be suspended from the support structure 312 via hoisting equipment, which may include a traveling block 318, a crown block (not shown), and a draw works 319 storing a support cable or line 323. The crown block may be connected to or otherwise supported by the support structure 312, and the traveling block 318 may be coupled with the top drive 316, such as via a hook 313 and/or other means. The draw works 319 may be mounted on or otherwise supported by the rig floor 314. The crown block and traveling block 318 comprise pulleys or sheaves around which the support line 323 is reeved to operatively connect the crown block, the traveling block 318, and the draw works 319 (and perhaps an anchor, not shown). The draw works 319 may thus selectively impart tension to the support line 323 to lift and lower the top drive 316, resulting in the vertical motion 335. The draw works 319 may comprise a drum, a frame, and a prime mover (e.g., an engine or motor) (not shown) operable to drive the drum to rotate and reel in the support line 323, causing the traveling block 318 and the top drive 316 to move upward. The draw works 319 may be operable to release the support line 323 via a controlled rotation of the drum, causing the traveling block 318 and the top drive 316 to move downward.

The top drive 316 may comprise a grabber, a swivel (neither shown), a tubular handling assembly link 327 terminating with an elevator 329, and a drive shaft 325 operatively connected with a prime mover (not shown), such as via a gear box or transmission (not shown). The drill string 320 may be mechanically coupled to the drive shaft 325 with or without a sub saver between the drill string 320 and the drive shaft 325. The prime mover may be selectively operated to rotate the drive shaft 325 and the drill string 320 coupled with the drive shaft 325. Hence, during drilling operations, the top drive 316 in conjunction with operation of the draw works 319 may advance the drill string 320 into the formation 306 to form the wellbore 302. The tubular handling assembly link(s) 327 and the elevator 329 of the top drive 316 may handle tubulars (e.g., drill pipes, drill collars, casing joints, etc.) that are not mechanically coupled to the drive shaft 325. For example, when the drill string 320 is being tripped into or out of the wellbore 302, the elevator 329 may grasp the tubulars of the drill string 320 such that the tubulars may be raised and/or lowered via the hoisting equipment mechanically coupled to the top drive 316. The grabber may include a clamp that clamps onto a tubular when making up and/or breaking out a connection of a tubular with the drive shaft 325. The top drive 316 may have a guide system (not shown), such as rollers that track up and down a guide rail on the support structure 312. The guide system may aid in keeping the top drive 316 aligned with the wellbore 302, and in preventing the top drive 316 from rotating during drilling by transferring reactive torque to the support structure 312.

The well construction system 300 may further include a well control system for maintaining well pressure control. For example, the drill string 320 may be conveyed within the wellbore 302 through various blowout preventer (BOP) equipment disposed at the wellsite surface 304 on top of the wellbore 302 and perhaps below the rig floor 314. The BOP equipment may be operable to control pressure within the wellbore 302 via a series of pressure barriers (e.g., rams) between the wellbore 302 and the wellsite surface 304. The BOP equipment may include a BOP stack 330, an annular preventer 332, and/or a rotating control device (RCD) 338 mounted above the annular preventer 332. The BOP equipment 330, 332, 338 may be mounted on top of a wellhead 334. The well control system may further include a BOP control unit 337 (i.e., a BOP closing unit) operatively connected with the BOP equipment 330, 332, 338 and operable to actuate, drive, operate or otherwise control the BOP equipment 330, 332, 338. The BOP control unit 337 may be or comprise a hydraulic fluid power unit fluidly connected with the BOP equipment 330, 332, 338 and selectively operable to hydraulically drive various portions (e.g., rams, valves, seals) of the BOP equipment 330, 332, 338.

The well construction system 300 may further include a drilling fluid circulation system operable to circulate fluids between the surface equipment 310 and the drill bit 326 during drilling and other operations. For example, the drilling fluid circulation system may be operable to inject a drilling fluid from the wellsite surface 304 into the wellbore 302 via an internal fluid passage 321 extending longitudinally through the drill string 320. The drilling fluid circulation system may comprise a pit, a tank, and/or other fluid container 342 holding the drilling fluid (i.e., mud) 340, and a pump 344 operable to move the drilling fluid 340 from the container 342 into the fluid passage 321 of the drill string 320 via a fluid conduit 346 extending from the pump 344 to the top drive 316 and an internal passage extending through the top drive 316. The fluid conduit 346 may comprise one or more of a pump discharge line, a stand pipe, a rotary hose, and a gooseneck (not shown) connected with a fluid inlet of the top drive 316. The pump 344 and the container 342 may be fluidly connected by a fluid conduit 348, such as a suction line.

During drilling operations, the drilling fluid may continue to flow downhole through the internal passage 321 of the drill string 320, as indicated by directional arrow 358. The drilling fluid may exit the BHA 324 via ports 328 in the drill bit 326 and then circulate uphole through an annular space 308 ("annulus") of the wellbore 302 defined between an exterior of the drill string 320 and the wall of the wellbore 302, such flow being indicated by directional arrows 359. In this manner, the drilling fluid lubricates the drill bit 326 and carries formation cuttings uphole to the wellsite surface 304. The returning drilling fluid may exit the annulus 308 via the RCD 338 and/or via a spool, a wing valve, a bell nipple, or another ported adapter 336, which may be located below one or more portions of the BOP stack 330.

The drilling fluid exiting the annulus 308 via the RCD 338 may be directed into a fluid conduit 360 (e.g., a drilling pressure control line), and may pass through various wellsite equipment fluidly connected along the conduit 360 prior to being returned to the container 342 for recirculation. For example, the drilling fluid may pass through a choke manifold 362 (e.g., a drilling pressure control choke manifold) connected along the conduit 360. The choke manifold 362 may include at least one choke and a plurality of fluid valves (neither shown) collectively operable to control the flow through and out of the choke manifold 362. Backpressure may be applied to the annulus 308 by variably restricting flow of the drilling fluid or other fluids flowing through the choke manifold 362. The greater the restriction to flow through the choke manifold 362, the greater the backpressure applied to the annulus 308.

The drilling fluid may also or instead exit the annulus 308 via the ported adapter 336 and into a fluid conduit 371 (e.g., rig choke line), and may pass through various equipment fluidly connected along the conduit 371 prior to being returned to the container 342 for recirculation. For example, the drilling fluid may pass through a choke manifold 373 (e.g., a rig choke manifold) connected along the conduit 371. The choke manifold 373 may include at least one choke and a plurality of fluid valves (neither shown) collectively operable to control the flow through the choke manifold 373. Backpressure may be applied to the annulus 308 by variably restricting flow of the drilling fluid or other fluids flowing through the choke manifold 373.

Before being returned to the container 342, the drilling fluid returning to the wellsite surface 304 may be cleaned and/or reconditioned via drilling fluid reconditioning equipment 370, which may include one or more of liquid gas separators, shale shakers, centrifuges, and other drilling fluid cleaning equipment. The liquid gas separators may remove formation gasses entrained in the drilling fluid discharged from the wellbore 302 and the shale shakers may separate and remove solid particles 341 (e.g., drill cuttings) from the drilling fluid. The drilling fluid reconditioning equipment 370 may further comprise equipment operable to remove additional gas and finer formation cuttings from the drilling fluid and/or modify physical properties or characteristics (e.g., rheology) of the drilling fluid. For example, the drilling fluid reconditioning equipment 370 may include a degasser, a desander, a desilter, a mud cleaner, and/or a decanter, among other examples. Intermediate tanks/containers (not shown) may be utilized to hold the drilling fluid while the drilling fluid progresses through the various stages or portions of the drilling fluid reconditioning equipment 370. The cleaned/reconditioned drilling fluid may be transferred to the fluid container 342, the solid particles 341 removed from the drilling fluid may be transferred to a solids container 343 (e.g., a reserve pit), and/or the removed gas may be transferred to a flare stack 372 via a conduit 374 (e.g., a flare line) to be burned or to a container (not shown) for storage and removal from the wellsite.

The surface equipment 310 may include tubular handling equipment operable to store, move, connect, and disconnect tubulars (e.g., drill pipes) to assemble and disassemble the conveyance means 322 of the drill string 320 during drilling operations. For example, a catwalk 331 may be utilized to convey tubulars from a ground level, such as along the wellsite surface 304, to the rig floor 314, permitting the tubular handling assembly links 327 to grab and lift the tubulars above the wellbore 302 for connection with previously deployed tubulars. The catwalk 331 may have a horizontal portion and an inclined portion that extends between the horizontal portion and the rig floor 314. The catwalk 331 may comprise a skate 333 movable along a groove (not shown) extending longitudinally along the horizontal and inclined portions of the catwalk 331. The skate 333 may be operable to convey (e.g., push) the tubulars along the catwalk 331 to the rig floor 314. The skate 333 may be driven along the groove by a drive system (not shown), such as a pulley system or a hydraulic system. Additionally, one or more racks (not shown) may adjoin the horizontal portion of the catwalk 331. The racks may have a spinner unit for transferring tubulars to the groove of the catwalk 331.

An iron roughneck 351 may be positioned on the rig floor 314. The iron roughneck 351 may comprise a torqueing portion 353, such as may include a spinner and a torque wrench comprising a lower tong and an upper tong. The torqueing portion 353 of the iron roughneck 351 may be moveable toward and at least partially around the drill string 320, such as may permit the iron roughneck 351 to make up and break out connections of the drill string 320. The torqueing portion 353 may also be moveable away from the drill string 320, such as may permit the iron roughneck 351 to move clear of the drill string 320 during drilling operations. The spinner of the iron roughneck 351 may be utilized to apply low torque to make up and break out threaded connections between tubulars of the drill string 320, and the torque wrench may be utilized to apply a higher torque to tighten and loosen the threaded connections.

Reciprocating slips 361 may be located on the rig floor 314, such as may accommodate therethrough the downhole tubulars during make up and break out operations and during the drilling operations. The reciprocating slips 361 may be in an open position during drilling operations to permit advancement of the drill string 320 therethrough, and in a closed position to clamp an upper end of the conveyance means 322 (e.g., assembled tubulars) to thereby suspend and prevent advancement of the drill string 320 within the wellbore 302, such as during the make up and break out operations.

During drilling operations, the hoisting equipment lowers the drill string 320 while the top drive 316 rotates the drill string 320 to advance the drill string 320 downward within the wellbore 302 and into the formation 306. During the advancement of the drill string 320, the reciprocating slips 361 are in an open position, and the iron roughneck 351 is moved away or is otherwise clear of the drill string 320. When the upper portion of the tubular in the drill string 320 that is made up to the drive shaft 325 is near the reciprocating slips 361 and/or the rig floor 314, the top drive 316 ceases rotating and the reciprocating slips 361 close to clamp the tubular made up to the drive shaft 325. The grabber of the top drive 316 then clamps the upper portion of the tubular made up to the drive shaft 325, and the drive shaft 325 rotates in a direction reverse from the drilling rotation to break out the connection between the drive shaft 325 and the made up tubular. The grabber of the top drive 316 may then release the tubular of the drill string 320.

Multiple tubulars may be loaded on the rack of the catwalk 331 and individual tubulars (or stands of two or three tubulars) may be transferred from the rack to the groove in the catwalk 331, such as by the spinner unit. The tubular positioned in the groove may be conveyed along the groove by the skate 333 until an end of the tubular projects above the rig floor 314. The elevator 329 of the top drive 316 then grasps the protruding end, and the draw works 319 is operated to lift the top drive 316, the elevator 329, and the new tubular.

The hoisting equipment then raises the top drive 316, the elevator 329, and the tubular until the tubular is aligned with the upper portion of the drill string 320 clamped by the slips 361. The iron roughneck 351 is moved toward the drill string 320, and the lower tong of the torqueing portion 353 clamps onto the upper portion of the drill string 320. The spinning system rotates the new tubular (e.g., a threaded male end) into the upper portion of the drill string 320 (e.g., a threaded female end). The upper tong then clamps onto the new tubular and rotates with high torque to complete making up the connection with the drill string 320. In this manner, the new tubular becomes part of the drill string 320. The iron roughneck 351 then releases and moves clear of the drill string 320.

The grabber of the top drive 316 may then clamp onto the drill string 320. The drive shaft 325 (e.g., a threaded male end) is brought into contact with the drill string 320 (e.g., a threaded female end) and rotated to make up a connection between the drill string 320 and the drive shaft 325. The grabber then releases the drill string 320, and the reciprocating slips 361 are moved to the open position. The drilling operations may then resume.

The tubular handling equipment may further include a pipe handling manipulator (PHM) 363 disposed in association with a fingerboard 365. Although the PHM 363 and the fingerboard 365 are shown supported on the rig floor 314, one or both of the PHM 363 and fingerboard 365 may be located on the wellsite surface 304 or another area of the well construction system 300. The fingerboard 365 provides storage (e.g., temporary storage) of tubulars (or stands of two or three tubulars) 311 during various operations, such as during and between tripping out and tripping in the drill string 320. The PHM 363 may be operable to transfer the tubulars 311 between the fingerboard 365 and the drill string 320 (i.e., space above the suspended drill string 320). For example, the PHM 363 may include arms 367 terminating with clamps 369, such as may be operable to grasp and/or clamp onto one of the tubulars 311. The arms 367 of the PHM 363 may extend and retract, and/or at least a portion of the PHM 363 may be rotatable and/or movable toward and away from the drill string 320, such as may permit the PHM 363 to transfer the tubular 311 between the fingerboard 365 and the drill string 320.

To trip out the drill string 320, the top drive 316 is raised, the reciprocating slips 361 are closed around the drill string 320, and the elevator 329 is closed around the drill string 320. The grabber of the top drive 316 clamps the upper portion of the tubular made up to the drive shaft 325. The drive shaft 325 then rotates in a direction reverse from the drilling rotation to break out the connection between the drive shaft 325 and the drill string 320. The grabber of the top drive 316 then releases the tubular of the drill string 320, and the drill string 320 is suspended by (at least in part) the elevator 329. The iron roughneck 351 is moved toward the drill string 320. The lower tong clamps onto a lower tubular below a connection of the drill string 320, and the upper tong clamps onto an upper tubular above that connection. The upper tong then rotates the upper tubular to provide a high torque to break out the connection between the upper and lower tubulars. The spinning system then rotates the upper tubular to separate the upper and lower tubulars, such that the upper tubular is suspended above the rig floor 314 by the elevator 329. The iron roughneck 351 then releases the drill string 320 and moves clear of the drill string 320.

The PHM 363 may then move toward the drill string 320 to grasp the tubular suspended from the elevator 329. The elevator 329 then opens to release the tubular. The PHM 363 then moves away from the drill string 320 while grasping the tubular with the clamps 369, places the tubular in the fingerboard 365, and releases the tubular for storage in the fingerboard 365. This process is repeated until the intended length of drill string 320 is removed from the wellbore 302.

The IPEM 100 is represented in a crowded FIG. 8 as being somewhat separated from the well construction system (drilling rig) 300. Even though not specifically highlighted in FIGS. 3-8, the IPEM 100 may be mounted next to the motor that it operates. In many applications (mud pumps, drawworks, etc.), the IPEM 100 may be mounted on the machine skid or even directly on the motor. In such cases, a power cable 381 between the IPEM 100 and the motor may be very short. Such cable 381 may be internal to the mounting system or inside a conduit (not shown) between the IPEM 100 and the motor that it operates. With such cabling, electrical resonance may be minimized.

Power is fed power to the IPEM 100 by cable(s) (not shown in FIG. 8). When multiple IPEMs are mounted on one large skid, the IPEMs may be connected in daisy chain or other connection schemes. The control of the IPEMs may be obtained via a control cable (e.g., a hybrid cable for command and emergency stop) or wirelessly. If wireless, wireless communication may be provided to perform the function of emergency stop.

The surface equipment 310 of the well construction system 300 may also comprise a control center 390 from which various portions of the well construction system 300, such as the top drive 316, the hoisting system, the tubular handling system, the drilling fluid circulation system, the well control system, the BHA 324, among other examples, may be monitored and controlled. The control center 390 may be located on the rig floor 314 or another location of the well construction system 300, such as the wellsite surface 304. The control center 390 may comprise a facility 391 (e.g., a room, a cabin, a trailer, etc.) containing a control workstation 397, which may be operated by a human wellsite operator 395 to monitor and control various wellsite equipment or portions of the well construction system 300. The control workstation 397 may comprise or be communicatively connected with a processing device 392 (e.g., a controller, a computer, etc.), such as may be operable to receive, process, and output information to monitor operations of and provide control to one or more portions of the well construction system 300. For example, the processing device 392 may be communicatively connected with the various surface and downhole equipment described herein, and may be operable to receive signals from and transmit signals to such equipment to perform various operations described herein. The processing device 392 may store executable program code, instructions, and/or operational parameters or set-points, including for implementing one or more aspects of methods and operations described herein. The processing device 392 may be located within and/or outside of the facility 391.

The control workstation 397 may be operable for entering or otherwise communicating control commands to the processing device 392 by the wellsite operator 395, and for displaying or otherwise communicating information from the processing device 392 to the wellsite operator 395. The control workstation 397 may comprise a plurality of human-machine interface (HMI) devices, including one or more input devices 394 (e.g., a keyboard, a mouse, a joystick, a touchscreen, etc.) and one or more output devices 396 (e.g., a video monitor, a touchscreen, a printer, audio speakers, etc.). Communication between the processing device 392, the input and output devices 394, 396, and the various wellsite equipment may be via wired and/or wireless communication means. However, for clarity and ease of understanding, such communication means are not depicted, and a person having ordinary skill in the art will appreciate that such communication means are within the scope of the present disclosure.

Well construction systems within the scope of the present disclosure may include more or fewer components than as described above and/or as depicted in FIG. 8. Additionally, various equipment and/or subsystems of the well construction system 300 shown in FIG. 8 may include more or fewer components than as described above and depicted in FIG. 8. For example, various engines, motors, hydraulics, actuators, valves, and/or other components not explicitly described herein may be included in the well construction system 300, and are within the scope of the present disclosure.

Figure 9:
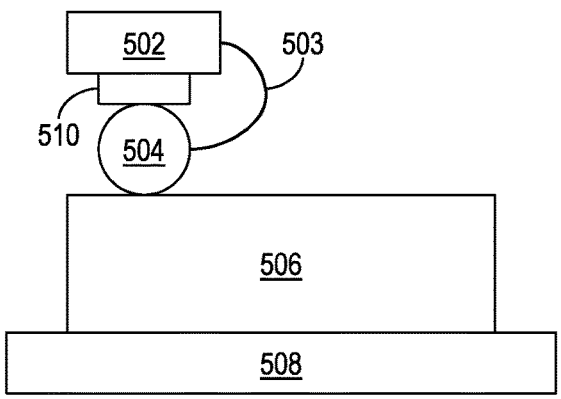
FIG. 9 is a schematic view of at least a portion of an example implementation of apparatus according to one or more aspects of the present disclosure.

FIG. 9 is a schematic view of an implementation in which an IPEM 502 is utilized to drive a motor 504 of a skid-mounted rig machine 506, such as a triplex or other mud pump, a drawworks, and/or other high-power machines. The IPEM 502 is as described above and/or otherwise within the scope of the present disclosure, such as the IPEM 100 shown in one or more of FIGS. 3-7. The rig machine 506 can be mounted on a skid 508, and the motor 504 can be mounted on the rig machine 506 (or the skid 508). The IPEM 502 may be mounted on the motor 504 via a deformable attachment 510. The deformable attachment 510 may comprise rubber, springs, shocks, and/or other means for dampening vibration of the motor 504 and/or the rig machine 506. A cable 503 may provide power from the IPEM 502 to the motor 504.

Figure 10:
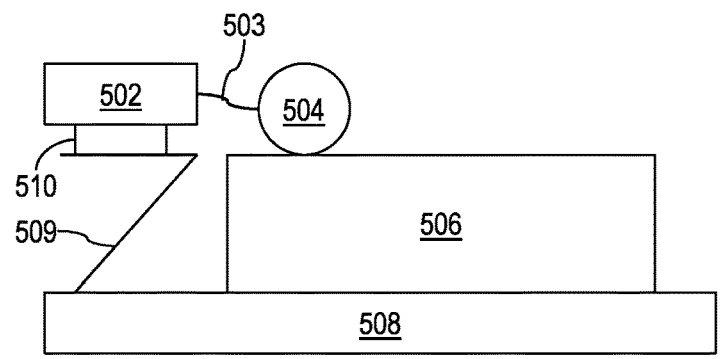
FIG. 10 is a schematic view of at least a portion of an example implementation of apparatus according to one or more aspects of the present disclosure.

FIG. 10 is a schematic view of a similar implementation in which the IPEM 502 is mounted on a support 509 that is mounted on the skid 508. The support 509 may be of various structures sturdy enough to support the IPEM 502. The deformable attachment 510 may still be utilized between the IPEM 502 and the support 509.

Figure 11:
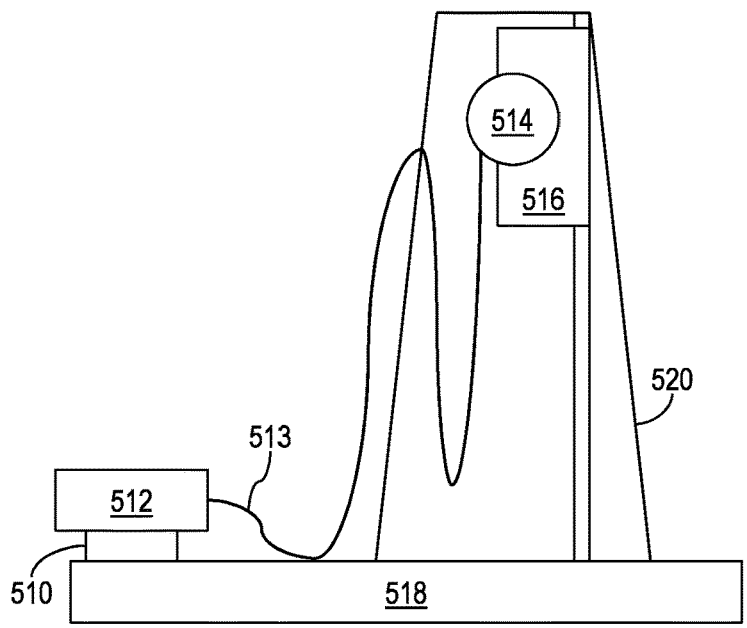
FIG. 11 is a schematic view of at least a portion of an example implementation of apparatus according to one or more aspects of the present disclosure.

In FIG. 11, an IPEM 512 is utilized to drive a motor 514 of a top drive 516. In such implementations, the power cable 513 may be part of the service loop connected to the top drive 516, and the IPEM 512 may be mounted on the rig floor 518, on the motor 514 and/or top drive 516, and/or to the mast 520. In each such case, the deformable attachment 510 may still be utilized.

Figure 12:
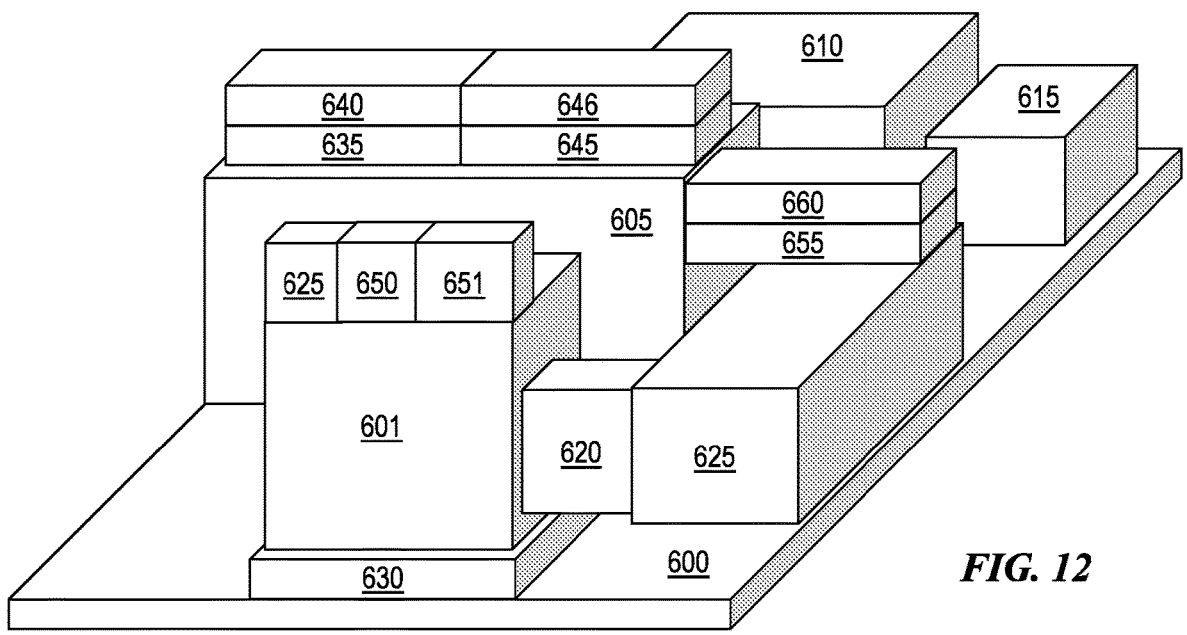
FIG. 12 is a schematic view of at least a portion of an example implementation of apparatus according to one or more aspects of the present disclosure.

FIG. 12 is a schematic view of at least a portion of an example implementation of a skid 600 according to one or more aspects of the present disclosure. Although the example skid 600 depicted in FIG. 12 is represented as a mud pump skid, a person having ordinary skill in the art will readily recognize that the aspects described herein should also be applicable or readily adaptable to a drawworks skid and/or other wellsite equipment.

The skid 600 includes a mud pump 605 attached to the skid. The mud pump 605 may be or comprise triplex pumps and/or other types of pumps. A centrifugal pump 610 driven by a motor 615 may operate in conjunction with the mud pump 605. A main motor 620 may drive the mud pump 605 via a belt system, a chain system, and/or other drive train 625. The motor 620 may be a large induction motor, such as having a power rating between about 400 HP and about 2500 HP, and/or otherwise operable to sufficiently drive the mud pump 605. In other implementations, the motor 620, perhaps still within the 400-2500 HP range, can be operable to sufficiently drive a drawworks, a top drive, or other high-power rig equipment. As described above, a VFD of an IPEM 601 may drive the motor 620, and the heat sink 625 and the fans 650 may be operable to manage heat generated during operation of the IPEM 601. The IPEM 601 may be similar to or the same as the IPEM 100 shown in FIGS. 3-8, the IPEM 502 shown in FIGS. 9 and 10, the IPEM 512 shown in FIG. 11, and/or other IPEM implementations within the scope of the present disclosure.

The skid 600 may also include an isolator 630 to decrease vibration of the skid 600 (e.g., resulting from vibration of the mud pump 605) transmitted to the IPEM 601. For example, the isolator 630 may be or may be similar to the deformable attachment 510 described above, and may comprise rubber or other compliant materials, springs, shocks, and/or other vibration damping means.

The mud pump 605 may include a lubrication system comprising an oil pump 635 driven by a motor 640. The lubrication system may include a cooling system comprising a fan 645 driven by a motor 646. The mud pump 605 may also include a piston cleaning system comprising a water pump 655 driven by a motor 660. Electrical power and control of the centrifugal pump motor 615, the oil pump motor 640, the cooling fan motor 646, and/or the water pump motor 660 may be via the IPEM 601. Such control may be via wired and/or wireless communication.

The IPEM 601 may control each of the motors 651, 615, 620, 640, 646, and 660 (among other possible motors included in the skid) for start/stop operation, as well as speed control where applicable. Various sensors (not shown) may be associated with one or more of the motors. For example, a pressure gauge associated with the lubrication system of the mud pump 605 may be utilized to verify the lubrication pump is delivering the correct pressure. If the lubrication pressure is not adequate, the integrated control system implemented by the IPEM 601 may prohibit operation of the main motor 620. Similar motor activation and control of the result of the motor activation may be implemented for the cooling system, whether for air-cooled systems, liquid-cooled systems, or combinations thereof, including the cooling systems described above. For example, information obtained via a temperature sensor installed in one or more locations may be utilized by the IPEM 601 to control the result of the intended cooling effect. Various additional examples exist for how the IPEM 601 may control certain components of the skid based on information sensed from other components of the skid, as well as information obtained elsewhere.

As described above, the "integrated system" introduced in the present disclosure includes an internal control system to manage each of the auxiliary functions utilized for the efficient and safe operation of at least a portion of a well construction system/drilling rig, such as a mud pump, a drawworks winch, or the like. The same applies to other implementations in which the main motor and the IPEM are at least partially integrated with a top drive and/or other main rig components. With such implementations, the rig control system may not be burdened with performing "local" decisions specific to a given mud pump skid, drawworks skid, top drive system, and/or other main rig machine. Instead, the rig control system may manage just the factors linked to the drilling rig and the drilling process as a whole. Consequently, even if a different machine is installed on the rig, the rig control system can just determine the drilling parameters and not deal with the local parameters of a specific machine.

The control system of the integrated skid may contain the parameters and logic to coordinate the axillary functions of the integrated skid in accordance with intended operation related to the drilling rig, as specified by the central computer of the drilling rig. For example, the control system of the integrated skid may hold calibration parameters of some or each of the sensors associated with the main and auxiliary machines of the skid. The control system may also hold other operational, maintenance (e.g., replacement parts and schedules), usage, and other information related to the main and auxiliary machines of the skid.

Figure 13:
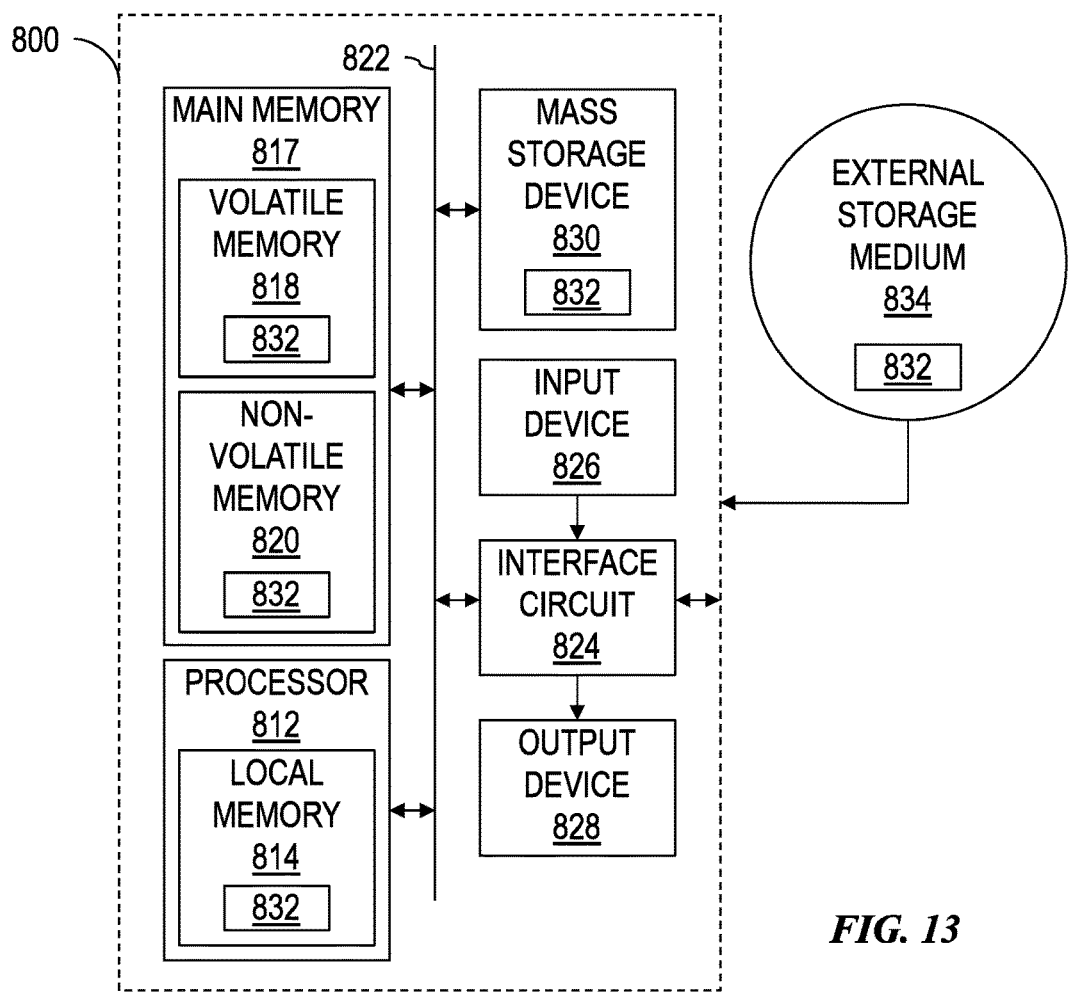
FIG. 13 is a schematic view of at least a portion of an example implementation of apparatus according to one or more aspects of the present disclosure.

FIG. 13 is a schematic view of at least a portion of an example implementation of a processing system 800 according to one or more aspects of the present disclosure. The processing system 800 may execute example machine-readable instructions to implement at least a portion of one or more of the methods and/or processes described herein, and/or to implement a portion of one or more of the example apparatus described herein. The processing system 800 may be or comprise, for example, one or more processors, controllers, special-purpose computing devices, servers, personal computers, personal digital assistant (PDA) devices, smartphones, internet appliances, and/or other types of computing devices. The controller 145 described above and/or other controllers within the scope of the present disclosure may be implemented by one or more instances of at least a portion of the processing system 800.

The processing system 800 may comprise a processor 812, such as a general-purpose programmable processor, for example. The processor 812 may comprise a local memory 814, and may execute program code instructions 832 present in the local memory 814 and/or another memory device. The processor 812 may execute, among other things, machine-readable instructions or programs to implement the methods and/or processes described herein. The programs stored in the local memory 814 may include program instructions or computer program code that, when executed by an associated processor, cause a controller and/or control system implemented in surface equipment and/or a downhole tool to perform tasks as described herein. The processor 812 may be, comprise, or be implemented by one or more processors of various types operable in the local application environment, and may include one or more general-purpose processors, special-purpose processors, microprocessors, digital signal processors (DSPs), field-programmable gate arrays (FPGAs), application-specific integrated circuits (ASICs), processors based on a multi-core processor architecture, and/or other processors.

The processor 812 may be in communication with a main memory 817, such as via a bus 822 and/or other communication means. The main memory 817 may comprise a volatile memory 818 and a non-volatile memory 820. The volatile memory 818 may be, comprise, or be implemented by random access memory (RAM), static random access memory (SRAM), synchronous dynamic random access memory (SDRAM), dynamic random access memory (DRAM), RAMBUS dynamic random access memory (RDRAM), and/or other types of random access memory devices. The non-volatile memory 820 may be, comprise, or be implemented by read-only memory, flash memory, and/or other types of memory devices. One or more memory controllers (not shown) may control access to the volatile memory 818 and/or the non-volatile memory 820.

The processing system 800 may also comprise an interface circuit 824. The interface circuit 824 may be, comprise, or be implemented by various types of standard interfaces, such as an Ethernet interface, a universal serial bus (USB), a third generation input/output (3GIO) interface, a wireless interface, and/or a cellular interface, among other examples. The interface circuit 824 may also comprise a graphics driver card. The interface circuit 824 may also comprise a communication device, such as a modem or network interface card, to facilitate exchange of data with external computing devices via a network, such as via Ethernet connection, digital subscriber line (DSL), telephone line, coaxial cable, cellular telephone system, and/or satellite, among other examples.

One or more input devices 826 may be connected to the interface circuit 824. One or more of the input devices 826 may permit a user to enter data and/or commands for utilization by the processor 812. Each input device 826 may be, comprise, or be implemented by a keyboard, a mouse, a touchscreen, a track-pad, a trackball, an image/code scanner, and/or a voice recognition system, among other examples.

One or more output devices 828 may also be connected to the interface circuit 824. One or more of the output devices 828 may be, comprise, or be implemented by a display device, such as a liquid crystal display (LCD), a light-emitting diode (LED) display, and/or a cathode ray tube (CRT) display, among other examples. One or more of the output devices 828 may also or instead be, comprise, or be implemented by a printer, speaker, and/or other examples.

The processing system 800 may also comprise a mass storage device 830 for storing machine-readable instructions and data. The mass storage device 830 may be connected to the interface circuit 824, such as via the bus 822. The mass storage device 830 may be or comprise a floppy disk drive, a hard disk drive, a compact disk (CD) drive, and/or digital versatile disk (DVD) drive, among other examples. The program code instructions 832 may be stored in the mass storage device 830, the volatile memory 818, the non-volatile memory 820, the local memory 814, and/or on a removable storage medium 834, such as a CD or DVD.

The mass storage device 830, the volatile memory 818, the non-volatile memory 820, the local memory 814, and/or the removable storage medium 834 may each be a tangible, non-transitory storage medium. The modules and/or other components of the processing system 800 may be implemented in accordance with hardware (such as in one or more integrated circuit chips, such as an ASIC), or may be implemented as software or firmware for execution by a processor. In the case of firmware or software, the implementation can be provided as a computer program product including a computer readable medium or storage structure containing computer program code (i.e., software or firmware) for execution by the processor.

Another aspect of the present disclosure involves a method comprising causing the simultaneous operation of a VFD, such as VFD 50 or a VFD that is a part of an IPEM for driving an electric motor, e.g., of a drilling rig machine and/or well construction equipment, and of a controller, such as for controlling temperature of an IGBT device of the VFD by controlling an air mover in response to real-time temperature data. The air mover may be as disclosed herein and may serve to generate airflow into a passage extending within the outer housing of an IPEM (such as IPEM 100, 502, 512, or 601), so that the airflow may thereby interact with radiating members extending into the passage from a heat sink thermally coupled with the IGBT in an inner housing outside the passage.

The real-time temperature data can come from monitoring one or more signals of one or more temperature sensors. The one or more temperature sensors may be indicative of temperature of one or more of the air outside the outer housing, air between the inner and outer housings, air within the inner housing, air within the passage downstream from the heat sink radiating members, and the IGBT, among other examples.

The controller (e.g., controller 145) may also be operable to control operation of the VFD. Additionally, or alternatively, the controller may be operable to control an exhaust valve operable to direct exhaust from the passage to between the inner and outer housings and/or external to the outer housing. The controller may also be operable to control a heating, ventilation, and air conditioning (HVAC) device. The HVAC device may be operable to condition and move air outside the outer housing into a volume between the inner and outer housings, and/or may be operable to control humidity within the volume between the inner and outer housings.

The air mover may be a first air mover, and the controller may also be operable to control an inlet valve. The inlet valve may be operable to control air flow into the passage from one or both of the first air mover and a second air mover operable to generate airflow within the passage from air in a volume between the inner and outer housings. The inner housing may be a first inner housing, and the controller may also be operable to control heat-generating electrical equipment disposed within a second inner housing that is disposed within the outer housing.

The drilling rig machine may comprise one or more of a mud pump, a drawworks, and a top drive.

The present disclosure also introduces a method of controlling temperature of an IGBT device (such as IGBT device 135) of a VFD (such as VFD 50 or a VFD that is a part of an IPEM for driving an electric motor, e.g., of a drilling rig machine and/or well construction equipment). The IGBT device may be disposed within an inner housing disposed within an outer housing, and may be thermally coupled to a heat sink comprising a base and radiating members extending from the base.

The method may include monitoring real-time temperature data as one or more signals of one or more temperature sensors. The one or more temperature sensors may be indicative of temperature of one or more of air outside the outer housing, air between the inner and outer housings, air within the inner housing, air within a passage downstream from the radiating members of the heat sink, and the IGBT device, among other examples.

The method may include controlling an air mover in response to the monitored real-time temperature data. The air mover may be as disclosed herein and may serve to generate airflow into a passage extending within the outer housing of an IPEM (such as IPEM 100, 502, 512, or 601), so that the airflow may thereby interact with radiating members extending into the passage from a heat sink thermally coupled with the IGBT in the inner housing outside the passage.

The controller may operate the air mover based on logic involving the real-time temperature data. For example, when the temperature of the air between the inner and outer housings is at or below a minimum housing temperature and the air within the passage downstream from the radiating members is above a minimum housing temperature, the controller may effectuate the discharging of air within the passage (downstream from the radiating members) into a volume between the inner and outer housings. As another example, when the temperature of the air outside the outer housing is at or below a minimum operating temperature of the IGBT device(s), the controller may effectuate the generating of the airflow into the passage from a volume between the inner and outer housings. Otherwise, the logic may include generating the airflow into the passage from the air outside the outer housing and discharging air within the passage (downstream from the radiating members) to outside the outer housing.

The controller may also be operable to control operation of the VFD. Additionally, or alternatively, the controller may be operable to control an exhaust valve operable to direct exhaust from the passage to between the inner and outer housings and/or external to the outer housing. The controller may also or instead be operable to control an HVAC device. The HVAC device may be operable to condition and move air outside the outer housing into a volume between the inner and outer housings, and/or may be operable to control humidity within the volume between the inner and outer housings.

The air mover may be a first air mover, and the controller may also be operable to control an inlet valve. The inlet valve may be operable to control air flow into the passage from one or both of the first air mover and a second air mover operable to generate airflow within the passage from air in a volume between the inner and outer housings. The inner housing may be a first inner housing, and the controller may also be operable to control heat-generating electrical equipment disposed within a second inner housing that is disposed within the outer housing.

The drilling rig machine may comprise one or more of a mud pump, a drawworks, and a top drive.

In view of the entirety of the present disclosure, including the figures and the claims, a person having ordinary skill in the art will readily recognize that the present disclosure introduces an apparatus comprising: an outer housing; an inner housing disposed within the outer housing; an IGBT of a VFD for converting input power to output power for driving an electric motor of a drilling rig machine, wherein the IGBT is disposed in the inner housing; a heat sink comprising a base coupled with the IGBT and radiating members extending from the base; ductwork at least partially defining a passage extending within the inner housing, wherein the heat sink radiating members extend at least partially within the passage; an air mover operable to move air from outside the outer housing through the passage; and a controller operable to control operation of the air mover based on temperature of one or more of the air outside the outer housing, air between the inner and outer housings, air within the inner housing, air within the passage downstream from the heat sink radiating members, and/or the IGBT.

The controller may be disposed within the inner housing.

The controller may be operable to control operation of the VFD.

The controller may be a first controller and the apparatus may comprise a second controller operable to control operation of the VFD. The first and second controllers may each be disposed within the inner housing.

The air mover may comprises an inlet baffle fluidly interposing the passage and the air outside the outer housing, and a fan operable to move the air outside the outer housing through the inlet baffle into the passage, wherein operation of the air mover by the controller may comprise operation of the inlet baffle, the fan, or both.

The passage may discharge into the outer housing.

The passage may discharge external to the outer housing.

The apparatus may comprise an exhaust valve operable to direct exhaust from the passage to a selectable one of: between the inner and outer housings; and external to the outer housing. The controller may be operable to control the exhaust valve based on the one or more temperatures.

The air mover may be a first air mover and the apparatus may comprise an inlet valve operable to control air flow into the passage from one or both of: the first air mover; and a second air mover operable to generate airflow within the passage from air in a volume between the inner and outer housings. The controller may be operable to control the inlet valve based on the one or more temperatures. The apparatus may comprise an HVAC device operable to condition and move air outside the outer housing into the volume. The controller may be operable to control the HVAC device. The HVAC device may be operable to control humidity within the volume. The inner housing may be a first inner housing and the apparatus may comprise: a second inner housing disposed within the outer housing; and heat-generating electrical equipment disposed within the second inner housing.

The apparatus may comprise the drilling rig machine. The drilling rig machine may comprise a mud pump, a drawworks, or a top drive. The drilling rig machine may be one of a plurality of drilling rig machines, the VFD may be one of a plurality of VFDs each having an IGBT within the inner housing for driving an electric motor of a corresponding one of the drilling rig machines, each IGBT may be coupled with a base of a corresponding heat sink, and each heat sink may comprise radiating members that extend at least partially within the passage. The apparatus may comprise the plurality of drilling rig machines. The drilling rig machines may include a mud pump, a drawworks, and a top drive.

The apparatus may not comprise a device primarily operable to alter temperature of air directed into the passage, other than the heat sink.

The air mover may not comprise a device primarily operable to alter temperature of air directed into the passage.

The present disclosure also introduces an apparatus comprising: an outer housing; an inner housing disposed within the outer housing; a passage extending within the outer housing; an air mover operable to generate airflow within the passage from air from outside the outer housing; an IGBT of a VFD for converting input power to output power for driving an electric motor of a drilling rig machine, wherein the IGBT is disposed in the inner housing outside the passage; a heat sink thermally coupled with the IGBT and having radiating members exposed to the airflow within the passage; and a controller operable to control temperature of the IGBT by controlling the air mover based on real-time temperature data.

The apparatus may comprise one or more temperature sensors outputting the real-time temperature data as one or more signals indicative of temperature of one or more of the air outside the outer housing, air between the inner and outer housings, air within the inner housing, air within the passage downstream from the heat sink radiating members, and the IGBT.

The passage may be proximal to a wall of the inner housing.

The controller may be disposed within the inner housing.

The controller may be operable to control operation of the VFD.

The controller may be a first controller and the apparatus may comprise a second controller operable to control operation of the VFD. The first and second controllers may each be disposed within the inner housing.

The air mover may comprise: an inlet baffle fluidly interposing the passage and the air outside the outer housing; and a fan operable to move the air outside the outer housing through the inlet baffle into the passage; wherein operation of the air mover by the controller comprises operation of the inlet baffle, the fan, or both.

The passage may discharge into the outer housing.

The passage may discharge external to the outer housing.

The apparatus may comprise an exhaust valve operable to direct exhaust from the passage to a selectable one of: between the inner and outer housings; and external to the outer housing. The controller may be operable to control the exhaust valve based on the one or more temperatures.

The air mover may be a first air mover and the apparatus may comprise an inlet valve operable to control air flow into the passage from one or both of: the first air mover; and a second air mover operable to generate airflow within the passage from air in a volume between the inner and outer housings. The controller may be operable to control the inlet valve based on the one or more temperatures. The apparatus may comprise an HVAC device operable to condition and move air outside the outer housing into the volume. The controller may be operable to control the HVAC device. The HVAC device may be operable to control humidity within the volume. The inner housing may be a first inner housing and the apparatus may comprise: a second inner housing disposed within the outer housing; and heat-generating electrical equipment disposed within the second inner housing.

The apparatus may comprise the drilling rig machine. The drilling rig machine may comprise one or more of a mud pump, a drawworks, and a top drive. The drilling rig machine may be one of a plurality of drilling rig machines; the VFD may be one of a plurality of VFDs each having an IGBT within the inner housing for driving an electric motor of a corresponding one of the drilling rig machines; each IGBT may be coupled with a base of a corresponding heat sink; and each heat sink may comprise radiating members that extend at least partially within the passage. The apparatus may comprise the plurality of drilling rig machines, which may comprise one or more of a mud pump, a drawworks, and a top drive.

The apparatus may not comprise a device primarily operable to alter temperature of air directed into the passage, other than the heat sink.

The air mover may not comprise a device primarily operable to alter temperature of air directed into the passage.

The present disclosure also introduces a method comprising causing simultaneous operation of: a VFD driving an electric motor of a drilling rig machine; and a controller controlling temperature of an IGBT of the VFD by controlling an air mover in response to real-time temperature data, the air mover generating airflow into a passage extending within the outer housing, the airflow thereby interacting with radiating members extending into the passage from a heat sink thermally coupled with the IGBT in the inner housing outside the passage.

The real-time temperature data may come from monitoring one or more signals of one or more temperature sensors indicative of temperature of one or more of the air outside the outer housing, air between the inner and outer housings, air within the inner housing, air within the passage downstream from the heat sink radiating members, and the IGBT.

The controller may be operable to control operation of the VFD.

The controller may be operable to control an exhaust valve, which may be operable to direct exhaust from the passage to a selectable one of: between the inner and outer housings; and external to the outer housing.

The air mover may be a first air mover and the controller may be operable to control an inlet valve, which may be operable to control air flow into the passage from one or both of: the first air mover; and a second air mover operable to generate airflow within the passage from air in a volume between the inner and outer housings.

The controller may be operable to control an HVAC device, which may be operable to condition and move air outside the outer housing into a volume between the inner and outer housings. The HVAC device may be operable to control humidity within the volume between the inner and outer housings.

The inner housing may be a first inner housing and the controller may be operable to control heat-generating electrical equipment disposed within a second inner housing that is disposed within the outer housing.

The air mover may generate airflow into the passage from air outside the outer housing.

The drilling rig machine may comprise one or more of a mud pump, a drawworks, and/or a top drive.

The airflow into the passage may not encounter a device primarily operable to alter its temperature, other than the heat sink.

The air mover may not comprise a device primarily operable to alter temperature of air directed into the passage.

The present disclosure also introduces a method of controlling temperature of an IGBT of a VFD driving an electric motor of a drilling rig machine, the IGBT being disposed within an inner housing, which is disposed within an outer housing, the IGBT being thermally coupled to a heat sink comprising a base and radiating members extending from the base, wherein the method comprises monitoring real-time temperature data as one or more signals of one or more temperature sensors indicative of temperature of one or more of: air outside the outer housing; air between the inner and outer housings; air within the inner housing; air within a passage downstream from the radiating members of the heat sink; and the IGBT. The method also comprises controlling an air mover in response to the monitored real-time temperature data, the air mover generating airflow into the passage, which extends within the outer housing, the airflow thereby interacting with the radiating members extending into the passage from the heat sink coupled with the IGBT that is disposed in the inner housing outside the passage. When the temperature of the air between the inner and outer housings is at or below a minimum housing temperature, and when the air within the passage downstream from the radiating members of the heat sink is above the minimum housing temperature, air within the passage downstream from the radiating members of the heat sink is discharged into a volume between the inner and outer housings. When the temperature of the air outside the outer housing is at or below a minimum operating temperature of the IGBT, the airflow into the passage is generated from a volume between the inner and outer housings. Otherwise, the airflow into the passage is generated from the air outside the outer housing, and air within the passage downstream from the radiating members of the heat sink is discharged to outside the outer housing.

The minimum housing temperature may be between about 10° C. and about 17° C.

The minimum operating temperature of the IGBT may be between about −40° C. and about −20° C.

The controller may be operable to control operation of the VFD.

The controller may be operable to control an exhaust valve, which may be operable to direct exhaust from the passage to a selectable one of: between the inner and outer housings; and external to the outer housing.

The air mover may be a first air mover and the controller may be operable to control an inlet valve, which may be operable to control air flow into the passage from one or both of: the first air mover; and a second air mover operable to generate airflow within the passage from air in a volume between the inner and outer housings.

The controller may be operable to control an HVAC device, which may be operable to condition and move air outside the outer housing into a volume between the inner and outer housings. The HVAC device may be operable to control humidity within the volume between the inner and outer housings.

The inner housing may be a first inner housing and the controller may be operable to control heat-generating electrical equipment disposed within a second inner housing that is disposed within the outer housing.

The air mover may generate airflow into the passage from air outside the outer housing.

The drilling rig machine may comprise one or more of a mud pump, a drawworks, and/or a top drive.

The airflow into the passage may encounter no device primarily operable to alter its temperature, other than the heat sink.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same functions and/or achieving the same benefits of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure. Moreover, implementations within the scope of the present disclosure include those having features shown in multiple figures, including implementations comprising one or more instances of a first feature shown in a first figure combined with one or more instances of a second feature shown in a second figure, even though the first feature is not shown or described in association with the second figure and/or the second feature is not shown or described in association with the first figure. Thus, the scope of the present disclosure includes implementations combining features collectively shown in two or more different figures or otherwise described herein, even though none of such figures independently show each feature in such combination.

The Abstract at the end of this disclosure is provided to comply with 37 C.F.R. § 1.72(b) to permit the reader to quickly ascertain the nature of the technical disclosure. It is submitted with the understanding that it will not be used to interpret or limit the scope or meaning of the claims.

What is claimed is:

1. An apparatus comprising:
    an outer housing;
    an inner housing disposed within the outer housing;
    a passage extending within the outer housing;
    an air mover operable to generate a first airflow within the passage from air from outside the outer housing;
    an insulated-gate bipolar transistor device (IGBT) of a variable-frequency drive (VFD) for converting input power to output power for driving an electric motor of a drilling rig machine, wherein the IGBT is disposed in the inner housing outside the passage;
    a heat sink thermally coupled with the IGBT and having radiating members exposed to the first airflow within the passage;
    a controller operable to control temperature of the IGBT by controlling the air mover based on real-time temperature data; and
    an exhaust valve operable to direct the first airflow from the passage to a selectable one of:
        between the inner and outer housings; and
        external to the outer housing.

2. The apparatus of claim 1 further comprising one or more temperature sensors outputting the real-time temperature data as one or more signals indicative of temperature of one or more of:
    the air outside the outer housing;
    air between the inner and outer housings;
    air within the inner housing;
    air within the passage downstream from the heat sink radiating members; and
    the IGBT.

3. The apparatus of claim 1 wherein the passage is proximal to a wall of the inner housing.

4. The apparatus of claim 1 wherein the air mover comprises:
    an inlet baffle fluidly interposing the passage and the air outside the outer housing; and
    a fan operable to move the air outside the outer housing through the inlet baffle into the passage;
    wherein operation of the air mover by the controller comprises operation of the inlet baffle, the fan, or both.

5. The apparatus of claim 1 wherein the controller is also operable to control the exhaust valve based on the one or more temperatures.

6. The apparatus of claim 1 wherein the air mover is a first air mover and the apparatus further comprises an inlet valve operable to control air flow into the passage from one or both of:
    the first air mover; and
    a second air mover operable to generate a second airflow within the passage from air in a volume between the inner and outer housings.

7. The apparatus of claim 6 wherein the controller is also operable to control the inlet valve based on the one or more temperatures.

8. The apparatus of claim 7 further comprising a heating, ventilation, and air conditioning (HVAC) device operable to condition and move air outside the outer housing into the volume.

9. The apparatus of claim 8 wherein the controller is also operable to control the HVAC device.

10. The apparatus of claim 1 further comprising the drilling rig machine, wherein the drilling rig machine comprises one or more of a mud pump, a drawworks, and a top drive.

11. A method comprising:
    causing simultaneous operation of:
        a variable-frequency drive (VFD) driving an electric motor of a drilling rig machine; and
        a controller controlling temperature of an insulated-gate bipolar transistor device (IGBT) of the VFD by controlling an air mover in response to real-time temperature data, the air mover generating a first airflow into a passage extending within an outer housing, the first airflow thereby interacting with radiating members extending into the passage from a heat sink thermally coupled with the IGBT in an inner housing outside the passage;

wherein the controller is also operable to control an exhaust valve, which is operable to direct the first airflow from the passage to a selectable one of:
between the inner and outer housings; and
external to the outer housing.

12. The method of claim 11 wherein the real-time temperature data comes from monitoring one or more signals of one or more temperature sensors indicative of temperature of one or more of:
the air outside the outer housing;
air between the inner and outer housings;
air within the inner housing;
air within the passage downstream from the heat sink radiating members; and
the IGBT.

13. The method of claim 11 wherein the controller is also operable to control operation of the VFD.

14. The method of claim 11 wherein the air mover is a first air mover and the controller is also operable to control an inlet valve, which is operable to control air flow into the passage from one or both of:
the first air mover; and
a second air mover operable to generate a second airflow within the passage from air in a volume between the inner and outer housings.

15. The method of claim 11 wherein the controller is also operable to control a heating, ventilation, and air conditioning (HVAC) device, which is operable to condition and move air outside the outer housing into a volume between the inner and outer housings.

16. The method of claim 11 wherein the air mover generates the first airflow into the passage from air outside the outer housing.

17. An apparatus comprising:
an outer housing;
an inner housing disposed within the outer housing;
a passage extending within the outer housing;
an air mover operable to generate a first airflow within the passage from air from outside the outer housing;
an insulated-gate bipolar transistor device (IGBT) of a variable-frequency drive (VFD) for converting input power to output power for driving an electric motor of a drilling rig machine, wherein the IGBT is disposed in the inner housing outside the passage;
a heat sink thermally coupled with the IGBT and having radiating members exposed to the first airflow within the passage; and
a controller operable to control temperature of the IGBT by controlling the air mover based on real-time temperature data;
wherein the air mover is a first air mover and the apparatus further comprises an inlet valve operable to control air flow into the passage from one or both of:
the first air mover; and
a second air mover operable to generate a second airflow within the passage from air in a volume between the inner and outer housings.

18. The apparatus of claim 17 wherein the controller is also operable to control the inlet valve based on the one or more temperatures.

19. The apparatus of claim 18 further comprising a heating, ventilation, and air conditioning (HVAC) device operable to condition and move air outside the outer housing into the volume.

20. The apparatus of claim 19 wherein the controller is also operable to control the HVAC device.

\* \* \* \* \*